(12) United States Patent
Lee

(10) Patent No.: US 12,245,458 B2
(45) Date of Patent: Mar. 4, 2025

(54) DISPLAY WITH DYED INTERLAYER TO REDUCE EXTERNAL REFLECTANCE

(71) Applicant: LG Display Co., Ltd., Seoul (KR)

(72) Inventor: MyoungHo Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 444 days.

(21) Appl. No.: 17/841,457

(22) Filed: Jun. 15, 2022

(65) Prior Publication Data

US 2023/0028691 A1  Jan. 26, 2023

(30) Foreign Application Priority Data

Jul. 23, 2021 (KR) .................. 10-2021-0097102

(51) Int. Cl.
| | | |
|---|---|---|
| H10K 50/86 | (2023.01) | |
| G09G 3/32 | (2016.01) | |
| H10K 59/122 | (2023.01) | |
| H10K 59/124 | (2023.01) | |
| H10K 59/38 | (2023.01) | |

(52) U.S. Cl.
CPC ......... *H10K 50/865* (2023.02); *H10K 59/124* (2023.02); *H10K 59/38* (2023.02); *G09G 3/32* (2013.01); *G09G 2300/0426* (2013.01); *G09G 2300/0452* (2013.01); *G09G 2300/0842* (2013.01); *H10K 59/122* (2023.02)

(58) Field of Classification Search
CPC .... H10K 50/865; H10K 59/124; H10K 59/38; H10K 59/122; H10K 59/351; H10K 59/8792; H10K 50/125; H10K 50/844; H10K 59/35; G09G 3/32; G09G 2300/0426; G09G 2300/0452; G09G 2300/0842; G09G 2320/0242; G09G 3/3258; G02B 5/22; G02B 5/201
See application file for complete search history.

(56) References Cited

U.S. PATENT DOCUMENTS

| | | | |
|---|---|---|---|
| 11,133,490 B2 * | 9/2021 | Jo | H10K 59/38 |
| 2015/0129852 A1 * | 5/2015 | Park | H10K 59/1213 |
| | | | 257/40 |
| 2018/0197921 A1 * | 7/2018 | Kim | H10K 71/00 |
| 2020/0185655 A1 * | 6/2020 | Jo | H10K 50/865 |

FOREIGN PATENT DOCUMENTS

| | | |
|---|---|---|
| KR | 10-2017-0010931 A | 2/2017 |
| KR | 10-2019-0069285 A | 6/2019 |
| KR | 10-2020-0075511 A | 8/2020 |

* cited by examiner

*Primary Examiner* — J. E. Schoenholtz
(74) *Attorney, Agent, or Firm* — Birch, Stewart, Kolasch & Birch, LLP

(57) ABSTRACT

A display device in one example includes a substrate composed of a first subpixel, a second subpixel, a third subpixel and a fourth subpixel. The substrate has a light emission area and a non-light emission area for each of the first to fourth subpixels. The display device further includes a thin film transistor disposed in each of the non-light emission areas of the substrate, a protective layer disposed on the thin film transistors, a color filter disposed on the protective layer and disposed in a light emission area of each of the first to third subpixels, an optical filter layer disposed on the color filter and including first to third absorbent materials, and a light emitting element disposed on the optical filter layer.

20 Claims, 9 Drawing Sheets

DISPLAY WITH DYED INTERLAYER TO REDUCE EXTERNAL REFLECTANCE

CROSS-REFERENCE TO RELATED APPLICATIONS

This application claims the priority benefit of the Korean Patent Application No. 10-2021-0097102 filed on Jul. 23, 2021, the entire contents of which are hereby expressly incorporated by reference into the present application.

BACKGROUND

Field of the Invention

The present disclosure relates to a display device.

Discussion of the Related Art

With the advancement of the information age, the demand for a display device for displaying images has increased in various forms. Therefore, various types of display devices such as a liquid crystal display (LCD) device, a quantum dot light emitting display (QLED) device, an inorganic light emitting display device, an organic light emitting display (OLED) device, and a micro-LED display device have been recently used.

Among the display devices, the organic light emitting display device, the quantum dot light emitting display device, the inorganic light emitting display device and the micro-LED display device are electroluminescence display devices, and are self-light emitting types. The electroluminescence display device has advantages in that a viewing angle and a contrast ratio are more excellent than those of the existing liquid crystal display (LCD) device.

Further, since the electroluminescence display device does not require a separate backlight, the electroluminescence display device has advantages such as it is able to be thin and lightweight and has low power consumption. Furthermore, the electroluminescence display device has advantages in that it can be driven at a low direct current voltage, has a fast response speed and especially has a low manufacturing cost.

The electroluminescence display device displays images in the form of a top emission type or a bottom emission type in accordance with the structure of a light emitting element that includes a first electrode, a second electrode, and a light emitting layer. The bottom emission type displays visible light generated from the light emitting layer toward a lower portion of a substrate in which a thin film transistor (TFT) is formed, whereas the top emission type displays the visible light generated from the light emitting layer toward an upper portion of the substrate in which the TFT is formed.

The electroluminescence display device further includes a polarizing plate to implement a black color thereof and reduce external light reflection, thereby improving visibility. However, when the electroluminescence display device uses the polarizing plate, transmittance of the electroluminescence display device is reduced, whereby a limitation can occur in that panel efficiency can be reduced and power consumption can be increased.

In order to address this limitation, there is a need for a method of reducing external light reflection without using the polarizing plate that reduces transmittance.

SUMMARY OF THE DISCLOSURE

The present disclosure has been formed in view of the above limitations and other issues and it is an object of the present disclosure to provide a display device that can reduce external light reflection without using a polarizing plate.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display device comprising a substrate including first to fourth subpixels and having a light emission area and a non-light emission area for each subpixel, a thin film transistor disposed in each of the non-light emission areas of the substrate, a protective layer disposed on the thin film transistor, a color filter disposed on the protective layer and disposed in a light emission area of each of the first subpixel, the second subpixel and the third subpixel, an optical filter layer disposed on the color filter, including a first absorbent material, a second absorbent material, and a third absorbent material, and a light emitting element disposed on the optical filter layer.

In accordance with another aspect of the present disclosure, the above and other objects can be accomplished by the provision of a display device comprising a substrate including first to fourth subpixels, having a light emission area and a non-light emission area for each subpixel, a thin film transistor disposed in the non-light emission area of the substrate, a protective layer disposed on the thin film transistor, a color filter disposed on the protective layer and disposed in a light emission area of each of the first to third subpixels, an organic insulating layer disposed on the color filter and the protective layer, an optical filter layer disposed on the organic insulating layer, including a first absorbent material, a second absorbent material, and a third absorbent material, and a light emitting element disposed on the optical filter layer.

In accordance with other aspect of the present disclosure, the above and other objects can be accomplished by the provision of a display device comprising a substrate including first to fourth subpixels, having a light emission area and a non-light emission area for each subpixel, a thin film transistor disposed in the non-light emission area of the substrate, a protective layer disposed on the thin film transistor, a color filter disposed on the protective layer and disposed in a light emission area of each of the first to third subpixels, an optical filter layer disposed in the light emission area of the fourth subpixel on the protective layer, including a first absorbent material, a second absorbent material, and a third absorbent material, an organic insulating layer disposed on the optical filter layer, the color filter and the protective layer, and a light emitting element disposed on the organic insulating layer.

In accordance with other aspect of the present disclosure, the above and other objects can be accomplished by the provision of a display device comprising a substrate including a first subpixel, a second subpixel, a third subpixel and a fourth subpixel, and having a light emission area and a non-light emission area for each of the first to fourth subpixels; a thin film transistor disposed in each of the non-light emission areas of the substrate; a protective layer disposed on the thin film transistors; a color filter disposed on the protective layer and disposed in the light emission area of each of the first to third subpixels; an optical filter layer disposed on the protective layer and disposed in the light emission area of the fourth subpixel, the optical filter layer including a first absorbent material, a second absorbent material, and a third absorbent material; and a light emitting element disposed on at least one of the color filter and the optical filter layer.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
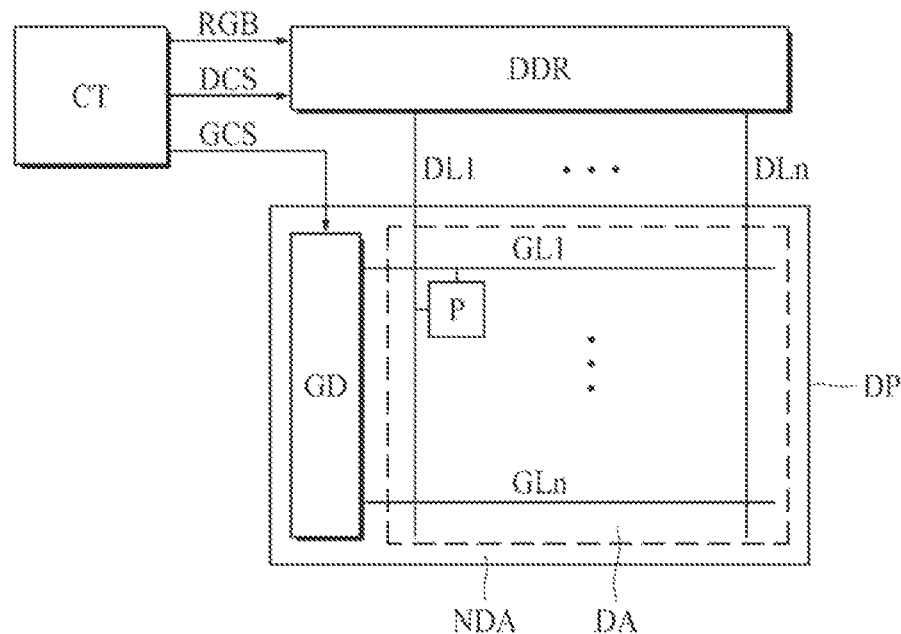
FIG. 1 is a schematic view illustrating a display device according to one embodiment of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle, a shading and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another part can be added unless 'only-' is used. The terms of a singular form can include plural forms unless referred to the contrary.

In construing an element, the element is construed as including an error band although there is no explicit description.

In describing a position relationship, for example, when the position relationship is described as 'upon-', 'above-', 'below-' and 'next to-', one or more portions can be disposed between two other portions unless 'just' or 'direct' is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

Further, in describing elements of the present disclosure, the terms "first", "second", etc. are intended to identify the corresponding elements from the other elements, and basis, order, or number of the corresponding elements are not limited by these terms. In addition, the expression that an element is "connected" or "coupled" to another element should be understood that the element can directly be connected or coupled to another element, one or more additional elements can be interposed between the corresponding elements, or the corresponding elements can be connected or coupled to each other through a third element.

Features of various embodiments of the present disclosure can be partially or overall coupled to or combined with each other and can be variously inter-operated with each other and driven technically as those skilled in the art can sufficiently understand. The embodiments of the present disclosure can be carried out independently from each other or can be carried out together in co-dependent relationship. Further, wherever a plurality of elements are mentioned and the term "the" is used before the element, then it would preferably imply "the" can be replaced with "each". For example, given a plurality of pixels are provided, if "the pixel" is mentioned, then this encompasses the meaning of "each pixel", even though not explicitly stated.

Hereinafter, various examples of a display device according to one or more embodiments of the present disclosure will be described in detail with reference to the accompanying drawings. All the components of each display device according to all embodiments of the present disclosure are operatively coupled and configured. In the drawings, the same or similar elements are denoted by the same reference numerals even though they are depicted in different drawings.

FIG. 1 is a schematic view illustrating a display device according to one embodiment of the present disclosure.

As shown in FIG. 1, the display device according to one embodiment of the present disclosure can include a display panel DP, a gate driver GD, a data driver DDR and a controller CT. The display panel DP can include a display area DA for displaying information or images and a non-display area NDA in which information or images are not displayed.

The display panel DP can include gate lines GL (GL1-GLn), data lines DL (DL1-DLn) and a plurality of pixels P, where each pixel P is disposed at an intersection area of the corresponding one of the gate lines GL and the corresponding one of the data lines DL. Here, n can represent positive numbers such as an integer greater than 1. Each pixel P includes a display element, and a pixel driving circuit PDC (see FIG. 2) for driving the display element. An image can be displayed on the display panel DP by driving of the pixel P.

The controller CT can control the gate driver GD and the data driver DDR.

The controller CT can output a gate control signal GCS for controlling the gate driver GD and a data control signal DCS for controlling the data driver DDR by using a vertical/horizontal synchronization signal and a clock signal, which are supplied from an external system. Further, the controller CT can sample input image data input from the external system and realign the sampled input image data to supply the image data RGB to the data driver DDR.

The gate control signal GCS can include a gate start pulse GSP, a gate shift clock GSC, a gate output enable signal GOE, a start signal Vst and a gate clock GCLK. Further, control signals for controlling a shift register can be included in the gate control signal GCS.

The data control signal DCS can include a source start pulse SSP, a source shift clock signal SSC, a source output enable signal SOE and a polarity control signal POL.

The data driver DDR can supply a data voltage to the data lines DL1 to DLn of the display panel DP. In detail, the data driver DDR can convert the image data RGB input from the controller CT into a data voltage, and can supply the data voltage to the data lines DL.

The gate driver GD can sequentially supply the gate pulse GP to the gate lines GL1 to GLn during one frame. In this case, the one frame refers to a period at which one image is outputted through the display panel DP. Further, the gate driver GD can supply a gate-off signal Goff, which can turn off a switching element, to the gate line GL during the other period of the one frame, at which the gate pulse GP is not supplied. Hereinafter, the gate pulse GP and the gate-off signal Goff are collectively referred to as a scan signal SS.

According to one embodiment of the present disclosure, the gate driver GD can be packaged on the display panel DP. In this way, a structure in which the gate driver GD is directly packaged on the display panel DP will be referred to as a gate in panel (GIP) structure.

Figure 2:
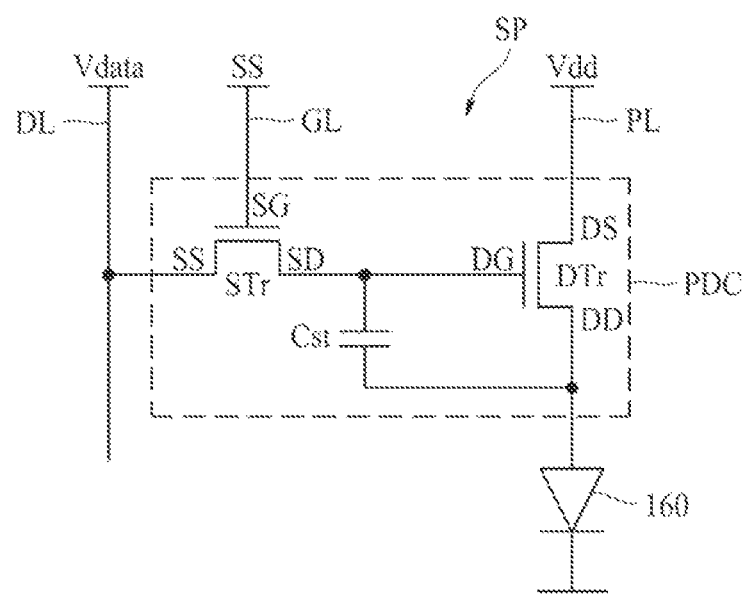
FIG. 2 is a circuit view illustrating any one subpixel SP of a plurality of subpixels included in a pixel P shown in FIG. 1.

FIG. 2 is a circuit view illustrating any one subpixel SP of a plurality of subpixels included in the pixel P shown in FIG. 1. For example, each subpixel among the plurality of subpixels included in each pixel P of FIG. 1 can have the configuration as shown in FIG. 2.

Referring to FIG. 2, the subpixel SP according to one embodiment of the present disclosure can include the pixel driving circuit PDC and a light emitting element 160 connected to the pixel driving circuit PDC.

The circuit view of FIG. 2 is an equivalent circuit view of one subpixel SP disposed in one pixel P of the display device in FIG. 1 that includes a light emitting diode LED as the light emitting element 160.

The pixel driving circuit PDC of FIG. 2 can include a switching transistor STr and a driving transistor DTr. As shown in FIG. 2, the switching transistor STr can be connected to the gate line GL and the data line DL. The switching transistor STr can be turned on or off by the scan signal SS supplied to a gate electrode SG of the switching transistor STr through the gate line GL.

The data line DL can provide a data voltage Vdata to the pixel driving circuit PDC as the data voltage is supplied to a source electrode SS of the switching thin film transistor (i.e., the switching transistor) STr, and the switching thin film transistor STr can control application of the data voltage Vdata.

A power line PL can provide a driving voltage Vdd to the light emitting element 160 as the driving voltage Vdd is supplied to a source electrode DS of the driving thin film transistor (i.e., the driving transistor) DTr, and the driving thin film transistor DTr can control the driving voltage Vdd. In this case, the driving voltage Vdd is a pixel driving voltage for driving the light emitting element 160.

The data line DL and the power line PL are lines that transfer signals. Therefore, according to one embodiment of the present disclosure, the data line DL and the power line PL are referred to as signal lines. Also, the gate line GL can also be referred to as a signal line because it transmits a signal.

When the switching thin film transistor STr is turned on, the data voltage Vdata supplied through the data line DL can be supplied to a gate electrode DG of the driving thin film transistor DTr connected to the light emitting element 160. The data voltage Vdata from a drain electrode SD of the switching thin film transistor STr can be charged in a storage capacitor Cst formed between the gate electrode DG and a drain electrode DD of the driving thin film transistor DTr.

The amount of a current supplied to the light emitting element 160 through the driving thin film transistor DTr can be controlled by the data voltage Vdata. Also, a gray scale of light output from the light emitting element 160 can be controlled by the data voltage Vdata.

Figure 3:
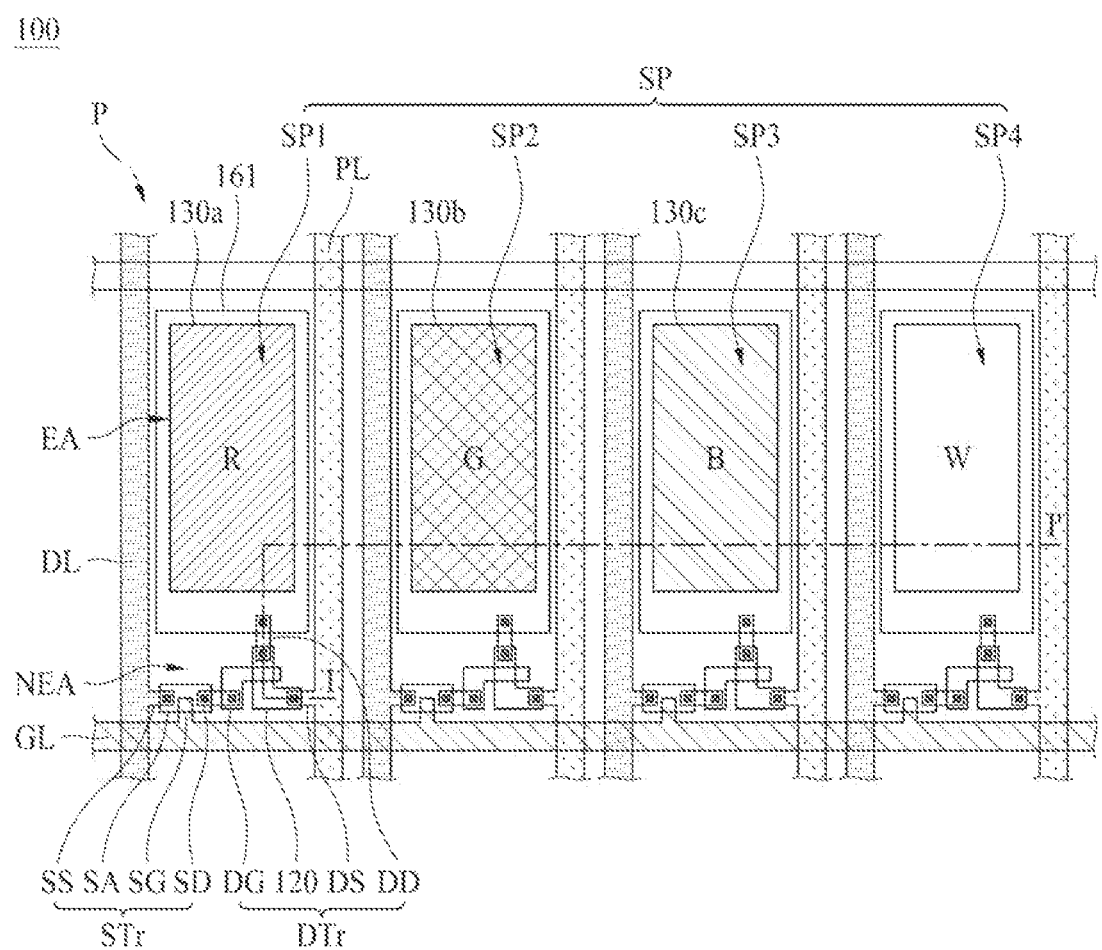
FIG. 3 is a plan view illustrating a structure in the pixel P shown in FIG. 1.

FIG. 3 is a plan view schematically illustrating a structure in each pixel P of the display device shown in FIG. 1 according to one example of the present disclosure. In more detail, FIG. 3 is a plan view schematically illustrating a structure of a plurality of subpixels formed in each pixel P shown in FIG. 1.

Figure 4:
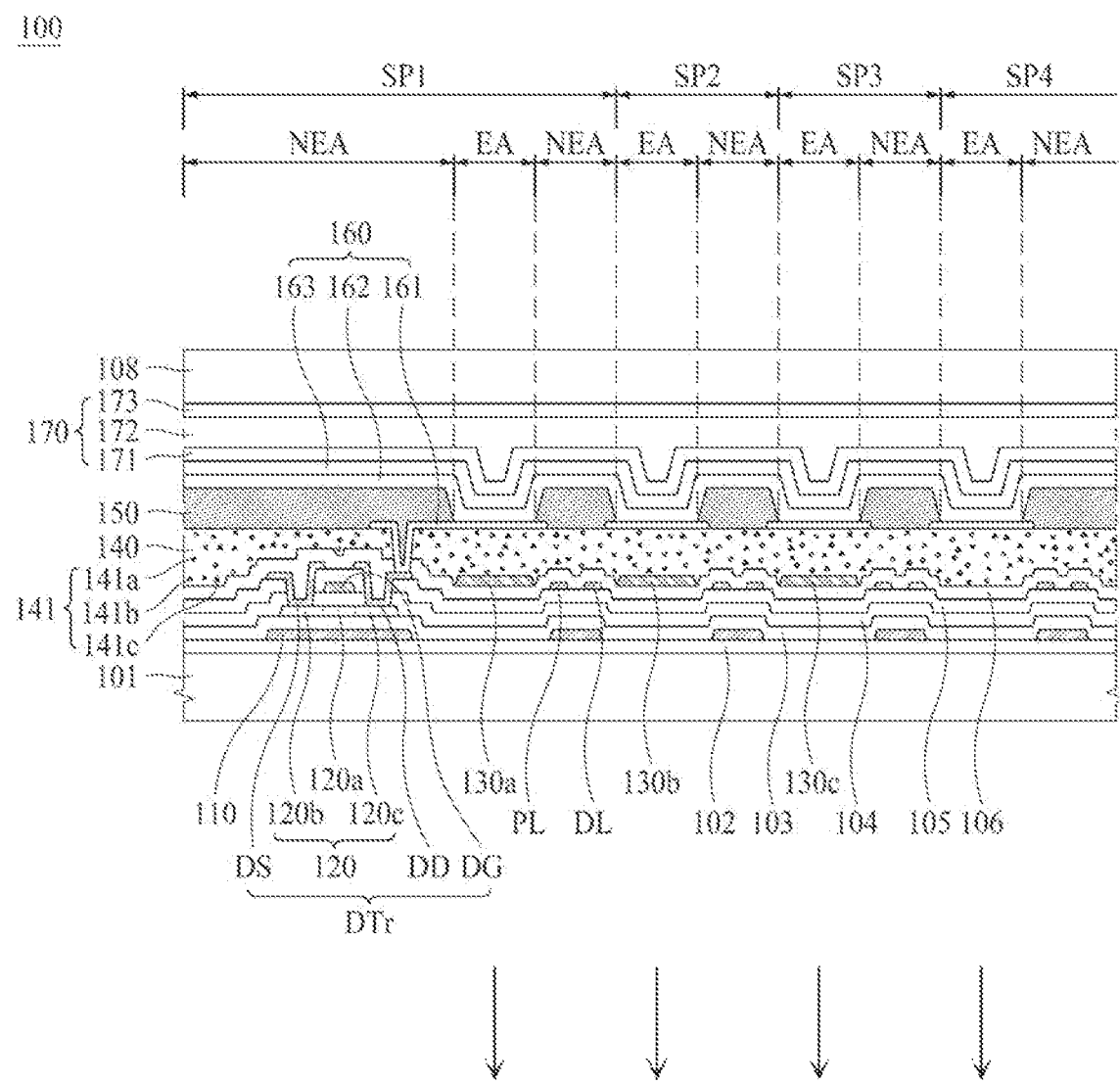
FIG. 4 is a cross-sectional view taken along line I-I' of FIG. 3 in a display device according to one embodiment of the present disclosure.

FIG. 4 is a cross-sectional view taken along line I-I' of FIG. 3. In detail, FIG. 4 is a cross-sectional view schematically illustrating a structure of a pixel P of a display device 100 according to one embodiment of the present disclosure, taken along line I-I' of FIG. 3. The display device 100 of FIG. 3 can correspond to the display device of FIGS. 1 and 2, e.g., it can have the same structure and configuration.

Figure 5A:
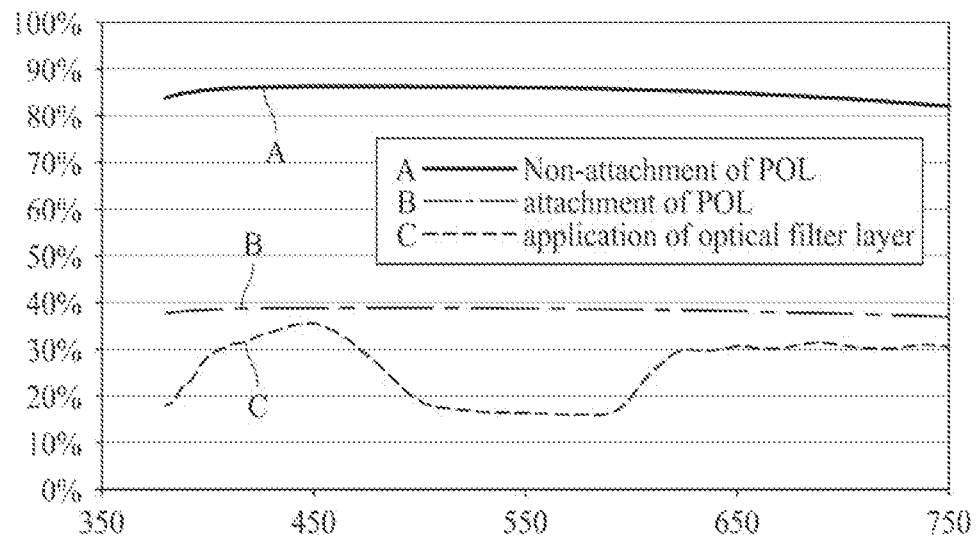
FIG. 5A is a graph illustrating one example of comparison in the reflectance of external light when a display device is in a non-light emission mode.
Figure 5B:
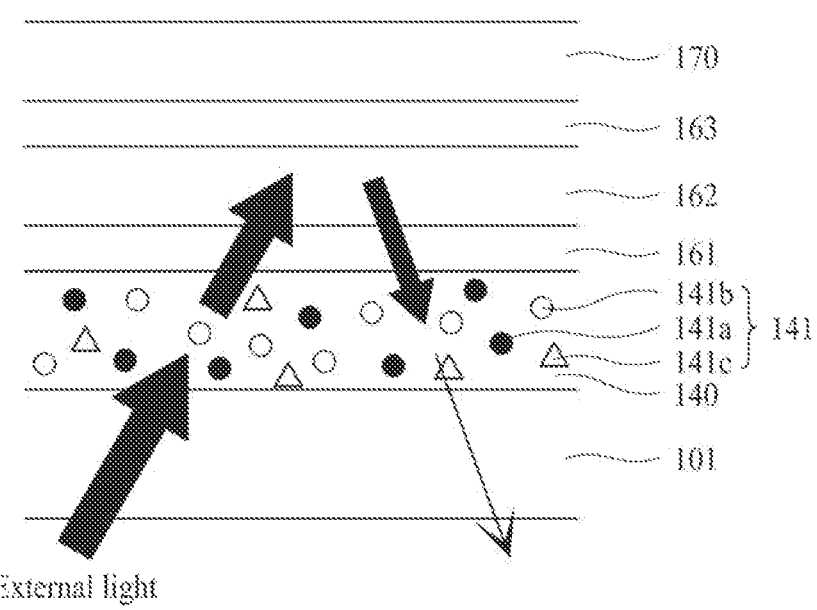
FIG. 5B is a cross-sectional view illustrating one example of the reflection attenuation of external light when a display device is in a non-light emission mode.
Figure 5C:
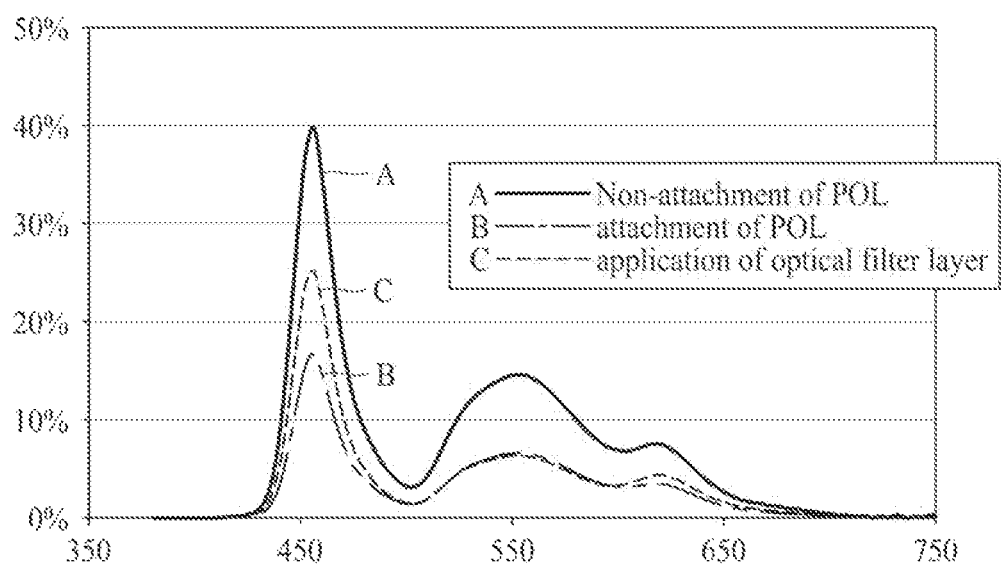
FIG. 5C is a graph illustrating one example of comparison in transmittance when a display device is in a light emission mode.

FIG. 5A is a graph illustrating comparison in the reflectance of external light when a display device is in a non-light emission mode. FIG. 5B is a cross-sectional view illustrating the reflection attenuation of external light when a display device is in a non-light emission mode. FIG. 5C is a graph illustrating comparison in transmittance when a display device is in a light emission mode.

An electroluminescence display device can be categorized into a top emission type and a bottom emission type depending on the transmission direction of light that is emitted. Hereinafter, a display device according to one or more embodiments of the present disclosure will be described with reference to a bottom emission type by way of example, but the present disclosure is not limited thereto and encompasses the top emission type.

Referring to FIGS. 3 and 4, the display device 100 according to one embodiment of the present disclosure can include a pixel P, a data line DL, a gate line GL, a power line PL, a switching thin film transistor STr, a driving thin film transistor DTr, color filters 130a, 130b and 130c, a light emitting element 160, a lower substrate 101, an upper substrate 108, an encapsulation portion 170, a bank 150 and an optical filter layer 140.

The pixel P can include a first subpixel SP1, a second subpixel SP2, a third subpixel SP3 and a fourth subpixel SP4. In addition, for each of the first subpixel SP1, the second subpixel SP2, the third subpixel SP3 and the fourth subpixel SP4, the substrate can include a light emission area EA and a non-light emission area NEA.

The switching thin film transistor STr includes a gate electrode SG, a semiconductor layer SA, a source electrode SS and a drain electrode SD, and the driving thin film transistor DTr includes a gate electrode DG, a semiconductor layer 120, a source electrode DS and a drain electrode DD.

In the display device 100 according to one embodiment of the present disclosure, the data line DL and the gate line GL crossing the data line DL can be disposed on the substrate 101. Each of a plurality of pixels P can be disposed in an intersection area of the corresponding data line DL and the corresponding gate line GL so that the plurality of pixels P are disposed in a matrix form to display an image.

Referring to FIG. 3, the pixel P can include a first subpixel SP1, a second subpixel SP2, a third subpixel SP3, and a fourth subpixel SP4.

The first subpixel SP1 can be a red subpixel R, and the second subpixel SP2 can be a green subpixel G. The third subpixel SP3 can be a blue subpixel B, and the fourth subpixel SP4 can be a white subpixel W. The first subpixel SP1, the second subpixel SP2, the third subpixel SP3 and the fourth subpixel SP4 can be disposed to be adjacent to one another in a first direction (e.g., X-axis direction). The same colored subpixels can be disposed to be adjacent to each other in a second direction (e.g., Y-axis direction). Each of the first subpixel SP1, the second subpixel SP2, the third subpixel SP3 and the fourth subpixel SP4 can supply a predetermined current to the light emitting element 160 in accordance with a data voltage of the data line DL when a gate signal of the gate line GL is input. Therefore, the light emitting element 160 of each of the first subpixel SP1, the second subpixel SP2, the third subpixel SP3, and the fourth subpixel SP4 can emit light with a predetermined brightness in accordance with a predetermined current. In addition, a power voltage VDD can be supplied to the power line PL. The power line PL can supply the power voltage to each of the first subpixel SP1, the second subpixel SP2, the third subpixel SP3 and the fourth subpixel SP4.

In the display device according to one embodiment of the present disclosure, the respective subpixels SP1, SP2, SP3 and SP4 are illustrated as being positioned with the same width in parallel, but are not limited thereto. The respective subpixels SP1, SP2, SP3 and SP4 (or some of them) can have their respective widths different from one another. In addition, the respective subpixels SP1, SP2, SP3 and SP4 can have their respective shapes different from one another.

Referring to FIG. 3, the subpixels SP1, SP2, SP3 and SP4 in the pixel P are illustrated as being disposed in the order of a red subpixel R, a green subpixel G, a blue subpixel B and a white subpixel W, but are not limited thereto. For example, in the pixel P, the red subpixel R, the white subpixel W, the green subpixel G, and the blue subpixel B can be disposed in that order. In another example, in the unit pixel P, the red subpixel R, the white subpixel W, the blue subpixel B, and the green subpixel G can be disposed in that order. In this and other ways, the subpixels of different colors or different combinations of colors can be disposed in each pixel P of each display device of the present disclosure in various ways.

Referring to FIG. 3, each of the subpixels SP1, SP2, SP3 and SP4 can include a light emission area EA and a non-light emission area NEA. As shown in FIG. 4, the light emission area EA can be defined by an open area of the bank 150. The light emission area EA will be described in detail with reference to FIG. 4.

The light emission areas EA can include the first electrode 161 and the color filters 130a, 130b, and 130c. The first electrode 161 is the first electrode 161 of the light emitting element 160 (also see FIG. 2). The non-light emission areas NEA can include the driving thin film transistor DTr, the switching thin film transistor STr, the gate line GL, the data line DL and the power line PL.

In the display device according to one embodiment of the present disclosure, the light emitting element 160 can emit white light. The light emission area EA of the first subpixel SP1 can emit red light, the light emission area EA of the second subpixel SP2 can emit green light, the light emission area EA of the third subpixel SP3 can emit blue light, and the light emission area EA of the fourth subpixel SP4 can emit white light. Therefore, a red color filter 130a for converting the emitted white light into red light can be disposed in the light emission area EA of the first subpixel SP1, a green color filter 130b for converting the emitted white light into green light can be disposed in the light emission area EA of the second subpixel SP2, and a blue color filter 130c for converting the emitted white light into blue light can be disposed in the light emission area EA of the third subpixel SP3. No color filter may be disposed in the light emission area EA of the fourth subpixel SP4. Therefore, in the light emission area EA of the fourth subpixel SP4, the emitted white light can be transmitted and emitted as it is.

Referring to FIG. 3, the driving thin film transistor DTr and the switching thin film transistor STr can be disposed in the non-light emission area NEA of each of the subpixels SP1, SP2, SP3 and SP4. As shown in FIGS. 3 and 4, the light emitting element 160, which includes the first electrode 161, a light emitting layer 162, and a second electrode 163, can be disposed in the light emission area EA of each of the subpixels SP1, SP2, SP3 and SP4.

As shown in FIG. 3, the switching thin film transistor STr and the driving thin film transistor DTr can be connected to each other, and the driving thin film transistor DTr can be connected to the first electrode 161 of the light emitting element 160 (see FIG. 4). For example, as shown in FIG. 3, the drain electrode SD of the switching thin film transistor STr can be connected to the gate electrode DG of the driving thin film transistor DTr. The drain electrode DD of the driving thin film transistor DTr can be connected to the first electrode 161 of the light emitting element 160.

Referring to FIG. 3, each of the subpixels SP1, SP2, SP3 and SP4 can be defined by the corresponding gate line GL, the corresponding data line DL and the power line PL, which are disposed on the substrate of the display panel DP in the display device 100.

The switching thin film transistor STr can be disposed in an area where the gate line GL and the data line DL cross each other. The switching thin film transistor STr can serve as a switching element for applying a signal to each of the subpixels SP1, SP2, SP3 and SP4. As mentioned above, the switching thin film transistor STr can include the gate electrode SG, the semiconductor layer SA, the source electrode SS and the drain electrode SD. The switching thin film transistor STr can be connected to the gate line GL and the data line DL. For example, the gate electrode SG of the switching thin film transistor STr can be connected to the gate line GL. The source electrode SG of the switching thin film transistor STr can be connected to the data line DL.

One side of the semiconductor layer SA of the switching thin film transistor STr can be connected to the source electrode SS of the switching thin film transistor STr through a contact hole. The other side of the semiconductor layer SA can be connected to the drain electrode SD of the switching thin film transistor STr via the contact hole.

The switching thin film transistor STr can be turned on or off by the scan signal supplied through the gate line GL. Therefore, when a data voltage is supplied through the data line DL, the switching thin film transistor STr can control that the data voltage is applied to each subpixel through the scan signal.

The driving thin film transistor DTr can serve to drive the light emitting element 160 of each respective one of the subpixels SP1, SP2, SP3 and SP4 based on a signal applied by the switching thin film transistor STr. Referring to FIG. 3, the gate electrode DG of the driving thin film transistor DTr can be connected to the drain electrode SD of the switching thin film transistor STr through the contact hole. Further, the source electrode DS of the driving thin film transistor DTr can be connected to the power line PL. The drain electrode DD of the driving thin film transistor DTr can be connected to the first electrode 161 of the light emitting element 160 through the contact hole.

One side of the semiconductor layer 120 of the driving thin film transistor DTr can be connected to the source electrode DS of the driving thin film transistor DTr through the contact hole. The other side of the semiconductor layer 120 can be connected to the drain electrode DD of the driving thin film transistor DTr through the contact hole.

Referring to FIG. 4, the display device 100 according to one embodiment of the present disclosure can include the lower substrate 101, a low reflection metal layer 110, the driving thin film transistor DTr, the power line PL, the data line DL, the color filters 130a, 103b and 130c, the optical filter layer 140, the bank 150, the light emitting element 160, the encapsulation portion 170, the upper substrate 108, a buffer layer 102, a first interlayer insulating layer 103, a gate insulating layer 104, a second interlayer insulating layer 105 and a protective layer 106.

In addition, the display device 100 according to one embodiment of the present disclosure can include the plurality of pixels P, and the plurality of subpixels SP can be disposed in each one unit pixel P. The plurality of subpixels SP can include the first subpixel SP1, the second subpixel SP2, the third subpixel SP3 and the fourth subpixel SP4. Each of the first subpixel SP1, the second subpixel SP2, the third subpixel SP3 and the fourth subpixel SP4 can include the light emission area EA and the non-light emission area NEA.

The lower substrate 101 can support various elements of the display device 100. The lower substrate 101 can be made of a plastic material having flexibility. When the lower substrate 101 is formed of a plastic material, for example, the lower substrate 101 can be made of polyimide PI, but is not limited thereto. The lower substrate 101 can be made of glass.

Referring to FIG. 4, the buffer layer 102 of a single layered structure or a multi-layered structure can be disposed on the substrate 101. The buffer layer 102 disposed on the substrate 101 can be formed of a single layer made of silicon nitride (SiNx) or silicon oxide (SiOx) or multiple layers thereof.

The buffer layer 102 can improve adhesion between layers formed thereon and the substrate 101, and can serve to block an alkali component discharged from the substrate 101. The buffer layer 102 is not an essential element, and can be omitted based on a type and material of the substrate 101 and a structure and type of the thin film transistor.

Referring to FIG. 4, in the non-light emission area NEA of each pixel P, the low reflection metal layer 110 can be disposed on the buffer layer 102. The low reflection metal layer 110 can be formed by sequentially stacking a lower metal layer, a transparent conductive layer, and an upper metal layer. The low reflection metal layer 110 can be disposed to overlap the thin film transistor or the signal line to prevent external light from being reflected by the thin film transistor or the signal line. The low reflection metal layer 110 can be disposed in the non-light emission area NEA.

The lower metal layer of the low reflection metal layer 110 can be formed of a single layer or multiple layers, which is(are) made of any one of molybdenum (Mo), copper (Cu), titanium (Ti), aluminum (Al), chromium (Cr), gold (Au), nickel (Ni), and neodymium (Nd) or an alloy thereof, but the material of the metal layer is not limited thereto. The transparent conductive layer disposed between the lower metal layer and the upper metal layer can be made of a transparent conductive material such as indium-tin-oxide (ITO), indium-zinc-oxide (IZO), and zinc oxide (ZnO). The upper metal layer can be formed of a single layer or multiple layers, which is(are) made of one of molybdenum (Mo), copper (Cu), titanium (Ti), aluminum (Al), chromium (Cr), gold (Au), nickel (Ni) and neodymium (Nd) or an alloy thereof. The upper metal layer and the lower metal layer can be made of the same material.

A portion of the external light can be reflected by the thin film transistor or the signal line by passing through the low reflection metal layer 110, and then can be removed or reduced while transmitting the low reflection metal layer 110. Further, another portion of the external light can be removed or reduced by optical destructive interference of light reflected from the lower metal layer of the low reflection metal layer 110 after transmitting the lower substrate 101 and light passing through the transparent conductive layer after being reflected from the upper metal layer by passing through the transparent conductive layer.

Referring to FIG. 4, the first interlayer insulating layer 103 can be disposed on the low reflection metal layer 110. The first interlayer insulating layer 103 can be formed of a single layer of silicon nitride (SiNx) or silicon oxide (SiOx), or multiple layers thereof.

As shown in FIG. 4, in the non-light emission area NEA of the pixel P, the driving thin film transistor DTr can be disposed on the first interlayer insulating layer 103. The driving thin film transistor DTr can include a semiconductor layer 120, a gate electrode DG, a source electrode DS, and a drain electrode DD. The source electrode DS can be a drain electrode and the drain electrode DD can be a source electrode, depending on the design of the circuit in the subpixel SP of the pixel P.

The semiconductor layer 120 of the driving thin film transistor DTr can be disposed on the first interlayer insulating layer 103 of the substrate 101.

The semiconductor layer 120 can include a poly-silicon. Since the poly-silicon material has high mobility (at least 100 cm$^2$/Vs), its energy consumption power is low and its reliability is excellent, whereby the poly-silicon material can be applied to a gate driver for a driving element for driving thin film transistors for a display element and/or a multiplexer MUX. In the display device according to one embodiment of the present disclosure, the semiconductor layer 120 can be applied as an active layer of the driving thin film transistor DTr, but is not limited thereto. For example, the semiconductor layer can be applied as an active layer of the switching thin film transistor STr depending on characteristics of the display device. The poly-silicon can be formed in a way of depositing an amorphous silicon (a-Si) material on the first interlayer insulating layer 103 and performing a dehydrogenation process and a crystallization process, and the semiconductor layer 120 can be formed by patterning the poly-silicon. The semiconductor layer 120 can include a channel area 120a in which a channel is formed when the driving thin film transistor DTr is driven, and a source area 120b and a drain area 120c on both sides of the channel area 120a. The source area 120b refers to a portion of the semiconductor layer 120 connected to the source electrode DS, and the drain area 120c refers to a portion of the semiconductor layer 120 connected to the drain electrode DD. The source area 120b and the drain area 120c can be formed by ion doping (impurity doping) of the semiconductor layer 120. The source area 120b and the drain area 120c can be formed by doping ions on the poly-silicon material, and the channel area 120a can refer to a portion that remain as a poly-silicon material without being doped with ions.

The semiconductor layer 120 can be formed of an oxide semiconductor. Since the oxide semiconductor material is a material having a band gap greater than that of the poly-silicon material, electrons fail to pass through the band gap in an off-state, and thus has a low off-current. Therefore, the thin film transistor including an active layer formed of an oxide semiconductor can be suitable for a switching thin film transistor that maintains a short on-time and a long off-time, but is not limited thereto. The thin film transistor can be applied as a driving thin film transistor depending on the characteristics of the display device. In addition, since the semiconductor layer 120 has a low off-current, a size of an auxiliary capacitance can be reduced, whereby the semiconductor layer 120 is suitable for a display element of high resolution. For example, the semiconductor layer 120 can be made of a metal oxide, for example, a variety of metal oxides such as indium-gallium-zinc-oxide (IGZO). It is assumed that the semiconductor layer 120 of the driving thin film transistor DTr is made of IGZO among various metal oxides. Therefore, the semiconductor layer 120 is described as being formed based on an IGZO layer, but is not limited thereto. The semiconductor layer 120 can be formed of other metal oxide such as indium-zinc-oxide (IZO), indium-gallium-tin-oxide (IGTO), or indium-gallium-oxide (IGO) instead of IGZO. The semiconductor layer 120 can be formed by depositing a metal oxide on the first interlayer insulating layer 103, performing a heat treatment process for stabilization, and patterning the metal oxide.

The gate insulating layer 104 can be disposed on the first interlayer insulating layer 103 and the semiconductor layer 120 of the driving thin film transistor DTr. The gate insulating layer 104 can be comprised of a single layer of silicon nitride (SiNx) or silicon oxide (SiOx), or multiple layers thereof. A contact hole can be formed in the gate insulating layer 104 to respectively connect the source electrode DS and the drain electrode DD of the driving thin film transistor DTr to the source area 120b and the drain area 120c of the semiconductor layer 120 of the driving thin film transistor DTr.

The gate electrode DG of the driving thin film transistor DTr and the gate line GL connected to the gate electrode DG can be disposed on the gate insulating layer 104. Each of the gate electrode DG and the gate line GL can be formed of a single layer or multiple layers, which is(are) made of one of molybdenum (Mo), copper (Cu), titanium (Ti), aluminum (Al), chromium (Cr), gold (Au), nickel (Ni), and neodymium (Nd), or an alloy thereof, but is not limited thereto. The gate electrode DG can be formed on the gate insulating layer 104 to overlap the channel area 120a of the semiconductor layer 120 of the driving thin film transistor DTr.

The second interlayer insulating layer 105 can be disposed on the gate insulating layer 104 to cover the gate electrode DG and the gate line GL. The second interlayer insulating layer 105 can be formed of a single layer of silicon nitride (SiNx) or silicon oxide (SiOx), or multiple layers thereof.

Referring to FIG. 4, a contact hole can be formed in the gate insulating layer 104 and the second interlayer insulating layer 105 to expose the semiconductor layer 120 of the driving thin film transistor DTr. For example, a contact hole for exposing the source area 120b and the drain area 120c of the semiconductor layer 120 can be formed.

The source electrode DS and the drain electrode DD of the driving thin film transistor DTr can be disposed on the second interlayer insulating layer 105. The source electrode DS and the drain electrode DD of the driving thin film transistor DTr can be connected to the semiconductor layer 120 of the driving thin film transistor DTr through the contact hole formed in the gate insulating layer 104 and the second interlayer insulating layer 105. Therefore, the source electrode DS of the driving thin film transistor DTr can be connected to the source area 120b of the semiconductor layer 120 through the contact hole formed in the gate insulating layer 104 and the second interlayer insulating layer 105. The drain electrode DD of the driving thin film transistor DTr can be connected to the drain area 120c of the semiconductor layer 120 through the contact hole formed in the gate insulating layer 104 and the second interlayer insulating layer 105. The power line PL and the data line DL can be disposed on the second interlayer insulating layer 105. The power line PL and the data line DL can be disposed in the non-light emission area NEA. The power line PL and the data line DL can overlap the low reflection metal layer 110.

Each of the power line PL, the data line DL, the source electrode DS and the drain electrode DD can be formed of a single layer or multiple layers, which is(are) made of one of molybdenum (Mo), copper (Cu), titanium (Ti), aluminum (Al), chromium (Cr), gold (Au), nickel (Ni), and neodymium (Nd), or an alloy thereof, but is not limited thereto. For example, each of the power line PL, the data line DL, the source electrode DS and the drain electrode DD can be formed of a three-layer structure of titanium (Ti)/aluminum (Al)/titanium (Ti), which is made of a conductive metal material.

The protective layer 106 can be disposed on the power line PL, the data line DL, the source electrode DS and the drain electrode DD. The protective layer 106 can be comprised of a single layer of silicon nitride (SiNx) or silicon oxide (SiOx), or multiple layers thereof, but is not limited thereto. The protective layer 106 can be formed of an organic material such as an acrylic resin, an epoxy resin, a phenolic resin, a polyamide resin, or a polyimide resin.

An auxiliary protective layer can be further disposed on the protective layer 106. The auxiliary protective layer can be comprised of a single layer of silicon nitride (SiNx) or silicon oxide (SiOx), or multiple layers thereof, but is not limited thereto.

Referring to FIG. 4, the color filter 130a, 130b and 130c can be disposed on the protective layer 106. The color filters 130a, 130b and 130c can be disposed in the light emission area EA in each pixel P. In more detail, the color filters 130a, 130b and 130c can be disposed in the light emission area EA in each of the subpixels SP1, SP2 and SP3, but not in the fourth subpixel SP4 since it is the white subpixel.

The color filters 130a, 130b and 130c are to convert a color of white light emitted from the light emitting layer 162 of the light emitting element 160. The red color filter 130a for converting the white light emitted from the light emitting layer 162 into red light can be disposed in the light emission area EA of the first subpixel SP1, and the green color filter 130b for converting the white light emitted from the light emitting layer 162 into green light can be disposed in the light emission area EA of the second subpixel SP2. The blue color filter 130c for converting the white light emitted from the light emitting layer 162 into blue light can be disposed in the light emission area EA of the third subpixel SP3.

However, no color filter can be disposed in the light emission area EA of the fourth subpixel SP4. Therefore, in the light emission area EA of the fourth subpixel SP4, the white light emitted from the light emitting layer 162 can be emitted by transmitting the lower substrate.

Referring to FIG. 4, the optical filter layer 140 can be disposed on the color filters 130a, 130b and 130c and the protective layer 106. The optical filter layer 140 can have a main absorption wavelength band of 520 nm to 580 nm. Preferably, the optical filter layer 140 can primarily absorb light of a wavelength band of 550 nm. The optical filter layer 140 can be formed to include an absorbent material 141 as being included in an organic layer. The organic layer can be formed of an organic material such as an acryl resin, an epoxy resin, a phenolic resin, a polyamide resin, or a polyimide resin. The absorbent material 141 can absorb light of a wavelength band of about 400 nm to 750 nm. In one example, the absorbent material 141 can be a material that primarily absorbs light of a wavelength band of about 520 nm to 580 nm even at the wavelength band of 400 nm to 750 nm.

The absorbent material 141 can include a first absorbent material 141a, a second absorbent material 141b, and a third absorbent material 141c, or a combination thereof. A main absorption wavelength band of the first absorbent material 141a is about 400 nm to 580 nm, and a main absorption wavelength band of the second absorbent material 141b is about 520 nm to 750 nm. A main absorption wavelength band of the third absorbent material 141c is about 400 nm to 520 nm and 580 to 750 nm.

The amount of the second absorbent material 141b can be greater than that of the first absorbent material 141a or the third absorbent material 141c. The amount of the first absorbent material 141a or the second absorbent material 141b can be greater than that of the third absorbent material 141c. Thus, the amount of the first absorbent material 141a contained in the optical filter layer 140 can be greater than that of the third absorbent material 141c, and the amount of the second absorbent material 141b can be greater than that of the third absorbent material 141c. The correlation between the amount of the first absorbent material 141a and the amount of the second absorbent material 141b can vary depending on a color temperature of the display device.

A mixture ratio (e.g., amount of material) of the first absorbent material 141a, the second absorbent material 141b, and the third absorbent material 141c preferably satisfies the following relation of.

the second absorbent material 141b>the first absorbent material 141a>the third absorbent material 141c, or the first absorbent material 141a>the second absorbent material 141b>the third absorbent material 141c.

For example, when the display device has a high color temperature, the relation of 'the second absorbent material 141b>the first absorbent material 141a>the third absorbent material 141c' is satisfied. When the display device has a low color temperature, the relation of 'the first absorbent material 141a>the second absorbent material 141b>the third absorbent material 141c' is satisfied.

The optical filter layer 140 that includes the first absorbent material 141a, the second absorbent material 141b and the third absorbent material 141c can reduce reflection of the external light in a non-emission mode and improve the transmittance of light in a light emission mode. Therefore, the display device comprising the optical filter layer 140 can improve transmittance by reducing loss of light emitted from the light emitting layer, and can improve reflection visibility of the external light.

Referring to FIG. 5A, the optical filter layer 140 can absorb light of a wavelength band of 400 nm to 750 nm from the external light. The optical filter layer 140 can absorb most of light having a wavelength band of 520 nm to 580 nm even at a wavelength band of 400 nm to 750 nm. Particularly, FIG. 5A is a graph illustrating comparison in the reflectance of external light in a non-light emission mode of the light emitting layer of the display device.

In FIG. 5A, when the light emitting layer is in a mode for displaying a black image without emitting light, after the external light is reflected from the second electrode 163 of the light emitting element 160 by transmitting the lower substrate 101, the reflected external light is emitted to the outside by passing through the lower substrate 101 again. This process is measured and represented by the graph of FIG. 5A. Here, X-axis represents the wavelength band (nm) of light, and Y-axis represents reflectance (%). A line A indicated by a solid line represents reflectance in the display device to which a polarizing plate POL is not attached, and a line B indicated by a dotted line represents reflectance in the display device to which the polarizing plate POL is attached. In addition, a line C indicated by a broken line is a graph showing reflectance in a display device comprising an optical filter layer (e.g., optical filter layer 140) according to one or more embodiments of the present disclosure.

As shown by the line A in FIG. 5A, it is noted that that reflectance of the external light is close to 90% in the display device to which the polarizing plate POL is not attached. Therefore, a problem can occur in that most of the external light is reflected and recognized by a user. It is also noted that as shown by the line B in FIG. 5A, the reflectance of the external light is 40%, approximately, in the display device to which the polarizing plate POL is attached.

Finally, in the display device comprising the optical filter layer according to one or more embodiments of the present disclosure, it is noted that as shown by line C in FIG. 5A, the reflectance of the external light is 15% to 38%. It is also noted by line C that reflectance at a wavelength band of 550 nm, which can be easily recognized by a user, is 15% that corresponds to a very low level.

As described above, the display device comprising the optical filter layer according to one or more embodiments of the present disclosure has reflection visibility more excellent than that of the display device to which a polarizing plate POL is attached.

Since light of a wavelength band of 520 nm to 580 nm can be easily recognized by a user, the optical filter layer 140 in the display device according to the present disclosure can include an absorbent material 141 that primarily absorbs light of a wavelength band of 520 nm to 580 nm. Light of a wavelength band of 550 nm can be easily recognized by a user at a wavelength band of 520 nm to 580 nm. Therefore, the light of the wavelength band of 550 nm can be absorbed by the optical filter layer 140 from the external light, whereby reflection visibility can be improved significantly.

The optical filter layer 140 can absorb light of a wavelength band of 400 nm to 750 nm. The optical filter layer 140 can primarily absorb light of a wavelength band of 520 nm to 580 nm among wavelengths of 400 nm to 750 nm. According to one embodiment of the present disclosure, a first absorbent material 141a having a main absorption wavelength band of 400 nm to 580 nm, a second absorbent material 141b having a main absorption wavelength band of 520 nm to 750 nm, and a third absorbent material 141c having a main absorption wavelength band of 400 nm to 520 nm and 580 to 750 nm can be mixed with one another to form the optical filter layer 140 that primarily absorbs light of a wavelength band of 520 nm to 580 nm.

Referring to FIG. 5B, in a non-light emission mode in which the light emitting layer 162 of the light emitting element 160 does not emit light, the external light can be partially absorbed when passing through the optical filter layer 140 by passing through the lower substrate 101. The external light passing through the optical filter layer 140 can be reflected by the second electrode 163 of the light emitting element 160 disposed in the light emission area EA. The external light reflected by the second electrode 163 can be absorbed once again while passing through the optical filter layer 140. Therefore, reflection visibility of the external light of the display device according to the present disclosure can be improved.

Referring to FIG. 5C, the display device comprising an optical filter layer according to one embodiment of the present disclosure reduces the reflectance of the external light and improves the transmittance of light emitted from the light emitting layer 162 of the light emitting element 160.

FIG. 5C is a graph illustrating comparison in the transmittance of light that is emitted in a light emission mode of the light emitting element. For example, FIG. 5C is a graph illustrating the amount of light, which finally passes through the lower substrate 101, for each wavelength band when the light emitted from the light emitting layer 162 of the light emitting element 160 is set to 100%. Here X-axis represents a wavelength band (nm) of light, and Y-axis represents transmittance (%). A line A indicated by a solid line represents transmittance in the display device to which the polarizing plate POL is not attached, and a line B indicated by a dotted line represents transmittance in the display device to which the polarizing plate POL is attached. Finally, a line C indicated by a broken line is a graph showing the transmittance in the display device comprising the optical filter layer (e.g., the optical filter layer 140) according to one or more embodiments of the present disclosure.

As shown by the line A in FIG. 5C, it is noted that the transmittance of light emitted from the display device to which the polarizing plate POL is not attached is 8 to 40%. It is also noted by the line B that the transmittance of light emitted from the display device to which the polarizing plate POL is attached is 4 to 15%. As described above, when the polarizing plate POL is attached, a problem can occur in that the transmittance of light is lowered.

Finally, in the display device comprising the optical filter layer according to one embodiment of the present disclosure, it is noted as shown by the line C that the transmittance of the emitted light is 5% to 25%.

Referring to the line A in FIG. 5C, the display device to which the polarization plate POL is not attached has the transmittance of 40% at 450 nm that is a blue wavelength band, has the transmittance of 15% at 550 nm that is a green wavelength band, and has the transmittance of 8% at 650 nm that is a red wavelength band.

As shown by the line B in FIG. 5C, the display device to which the polarization plate POL is attached has the transmittance of 15% at 450 nm that is a blue wavelength band, has the transmittance of 8% at 550 nm that is a green wavelength band and has the transmittance of 4% at 650 nm that is a red wavelength band.

Finally, as shown by the line C in FIG. 5C, in the display device comprising the optical filter layer according to one embodiment of the present disclosure, the display device comprising the optical filter layer has the transmittance of 25% at 450 nm that is a blue wavelength band, has the transmittance of 8% at 550 nm that is a green wavelength band and has the transmittance of 5% at 650 nm that is a red wavelength band.

As described above, the display device comprising the optical filter layer according to one embodiment of the present disclosure has a better transmittance than that of the display device to which a polarizing plate POL is attached.

As shown in FIGS. 5A and 5C, in the display device comprising the optical filter layer according to one embodiment of the present disclosure, reflection visibility of the external light can be improved and transmittance of the emitted light can be improved.

According to examples, the first absorbent material 141a included in the optical filter layer 140 can be the same material as that of the blue color filter 130c. The second absorbent material 141b can be the same material as that of the red color filter 130a, and the third absorbent material 141c can be the same material as that of the green color filter 130c.

The first absorbent material 141a, the second absorbent material 141b and the third absorbent material 141c can each include a pigment material. For example, the first absorbent material 141a can include C.I pigment Blue 15:6, and the second absorbent material 141b can include C.I pigment Yellow 185. The third absorbent material 141c can include C.I pigment Green 7. Therefore, C.I pigment Green 7, C.I pigment Yellow 185 and C.I pigment Blue 15:6 can be configured in combination, but are not limited thereto.

The first absorbent material 141a, the second absorbent material 141b, and the third absorbent material 141c can each include a dye material.

Referring to FIG. 4, the first electrode 161 of the light emitting element 160 can be disposed on the optical filter layer 140. The first electrode 161 can be electrically connected to the driving thin film transistor DTr through a contact hole formed in the optical filter layer 140, the protective layer 106, the second interlayer insulating layer 105 and the gate insulating layer 104. For example, the first electrode 161 of the light emitting element 160 can be electrically connected to the drain electrode DD of the driving thin film transistor DTr through the contact hole to allow a current for driving the light emitting element to be supplied thereto.

The first electrode 161 can be formed of a transparent metal material, a semi-transparent metal material, or a metal material having high reflectance. The first electrode 161 can be formed of a transparent conductive material (TCO) such as ITO and IZO, which can transmit light, or a semi-transmissive conductive material such as magnesium (Mg), silver (Ag), or an alloy of magnesium (Mg) and silver (Ag). The first electrode 161 can be an anode electrode, but is not limited thereto, the first electrode 161 can be formed of a metal material having high reflectance, such as a stacked structure (Ti/Al/Ti) of aluminum and titanium, a stacked structure (ITO/Al/ITO) of Al and ITO, an Ag alloy, and a stacked structure (ITO/Ag alloy/ITO) of Ag alloy and ITO. The Ag alloy can be an alloy of silver (Ag), palladium (Pd), and copper (Cu).

The first electrode 161 can be disposed to be patterned for each of the subpixels SP1, SP2, SP3 and SP4 on the optical filter layer 140. For example, one first electrode 161 can be formed on the optical filter layer 140 disposed in the first subpixel SP1, another first electrode 161 can be formed on the optical filter layer 140 disposed in the second subpixel SP2, and still another first electrode 161 can be formed on the optical filter layer 140 disposed in the third subpixel SP3. Further, further still another first electrode 161 can be formed on the optical filter layer 140 disposed in the fourth subpixel SP4.

Referring to FIG. 4, the first electrode 161 can be disposed to be directly in contact with an upper surface of the optical filter layer 140. The first electrode 161 can be disposed to overlap or to be in the light emission area EA. Therefore, the first electrode 161 can overlap the color filters 130a, 130b and 130c.

The bank 150 can be disposed on the first electrode 161 and the optical filter layer 140. The bank 150 can be provided between the first electrodes 161 provided in each of the subpixels SP1, SP2, SP3 and SP4. The bank 150 can be formed to cover an end or edge of each of the first electrodes 161 and expose a portion of each of the first electrodes 161. Therefore, the bank 150 can prevent light emission efficiency from being deteriorated due to concentration of a current on the end of the first electrode 161.

The bank 150 can define the light emission area EA in each of the plurality of subpixels SP1, SP2, SP3 and SP4. Since the bank 150 can define the light emission area of the display device 100, it can be referred to as a pixel definition layer. For example, an area in which the bank 150 is not formed in each of the sub-pixels SP1, SP2, SP3 and SP4 and the first electrode 161 is exposed can be the light emitting area EA. In addition, the area except the light emission area EA can be the non-light emission area NEA. As shown in FIG. 4, an area where an upper surface of the first electrode 161 exposed by the open area of the bank 180 in each of the subpixels SP1, SP2, SP3 and SP4 is directly in contact with a lower surface of the light emitting layer 162 can be defined as the light emission area EA. The area except the light emission area EA becomes the non-light emission area NEA.

Referring to FIG. 4, the bank 150 can be disposed in the non-light emission area NEA. Therefore, the bank 150 can overlap the driving thin film transistor DTr, the power line PL, the data line DL and the low reflection metal layer 110. The bank 150 can also overlap the switching thin film transistor STr.

The bank 150 can include an organic material. For example, the bank 150 can be formed of an acrylic resin, an epoxy resin, a phenolic resin, a polyamide resin, or a polyimide resin. The bank 150 can also include a light absorbent material. The bank 150 can have a black-based color. Therefore, the bank 150 can be a black bank. For example, the bank 150 can include an insulating light absorbent material such as a black resin or graphite. The bank 150 that includes the light absorbent material can block light from moving in the direction of the light emission area EA of the adjacent subpixels SP1, SP2, SP3 and SP4.

Referring to FIG. 4, the light emitting layer 162 of the light emitting element 160 can be disposed on the bank 150 and the first electrode 161. The light emitting layer 162 can be connected between adjacent subpixels without being disconnected.

The light emitting layer 162 can be a layer that emits white light. The light emitting layer 162 can include a first light emitting layer and a second light emitting layer, which face each other with a charge generation layer CGL interposed therebetween. In this case, one of the first light emitting layer and the second light emitting layer can generates blue light, and the other one of the first and second light emitting layers can generate yellow-green light to generate white light through the first and second light emitting layers. The white light generated by the light emitting layer 162 can be incident upon the color filters 130a, 130b and 130c disposed below the light emitting layer to implement a color image.

For example, a light emitting element can include a first light emitting stack for emitting light of a first color, a second light emitting stack for emitting light of a second color, and a charge generation layer CGL provided between the first light emitting stack and the second light emitting stack, but is not limited thereto. For example, the light emitting element can be formed by stacking the first light emitting stack, the second light emitting stack and the third light emitting stack. A first charge generation layer can be disposed between the first light emitting stack and the second light emitting stack, and a second charge generation layer can be disposed between the second light emitting stack and the third light emitting stack. Alternatively, the light emitting element can have a structure that includes first to fourth light emitting stacks and first to third charge generation layers. In the display device according to the present disclosure, the light emitting element, which includes a first light emitting stack, a second light emitting stack, and a charge generation layer CGL provided between the first light emitting stack and the second light emitting stack, will be described as an example.

The first light emitting stack can be disposed on the first electrode 161. The first light emitting stack can have a structure in which a hole injecting layer HIL, a hole transporting layer HTL, a first light emitting layer for emitting light of a first color, and an electron transporting layer ETL are sequentially stacked, but is not limited thereto. The first light emitting layer can be at least one of a red light emitting layer for emitting red light, a green light emitting layer for emitting green light, a blue light emitting layer for emitting blue light and a yellow light emitting layer for emitting yellow light, but is not limited thereto.

The charge generation layer CGL can have a structure in which an N-type charge generation layer for providing electrons to the first light emitting stack and a P-type charge generation layer for providing holes to the second light emitting stack are stacked.

The second light emitting stack can be disposed on the charge generation layer. The second light emitting stack can have a structure in which the hole transporting layer HTL, the second light emitting layer for emitting light of a second color, an electron transporting layer ETL, and an electron injecting layer EIL are sequentially stacked, but is not limited thereto. The second light emitting layer can be at least one of a red light emitting layer for emitting red light, a green light emitting layer for emitting green light, a blue light emitting layer for emitting blue light, and a yellow light emitting layer emitting yellow light, but is not limited thereto.

The second light emitting layer can emit light of a color different from that of the first light emitting layer. For example, the first light emitting layer can include a blue light emitting layer for emitting blue light, and the second light emitting layer can include a yellow light emitting layer for emitting yellow light. For another example, the first light emitting layer can include a blue light emitting layer for emitting blue light, and the second light emitting layer can include a red light emitting layer for emitting red light and a green light emitting layer for emitting green light.

Referring to FIG. 4, the second electrode 163 can be disposed on the light emitting layer 162. The second electrode 163 can be connected between adjacent subpixels without being disconnected.

The second electrode 163 can be formed of a metal material having high reflectance, such as a stacked structure (Ti/Al/Ti) of aluminum and titanium, a stacked structure (ITO/Al/ITO) of Al and ITO, an Ag alloy, and a stacked structure (ITO/Ag alloy/ITO) of Ag alloy and ITO, but is not limited thereto. The second electrode 163 can be formed of a single layer made of a metal material such as aluminum (Al), copper (Cu), molybdenum-titanium alloy (MoTi), molybdenum (Mo), and titanium (Ti). The Ag alloy can be an alloy such as silver (Ag), palladium (Pd), and copper (Cu). The second electrode 163 can be a cathode electrode.

The encapsulation portion 170 can be disposed on the light emitting element 160. For example, an encapsulation portion 170 can be further disposed on the second electrode 163 of the light emitting element 160 to suppress moisture permeation.

The encapsulation portion 170 can include a first inorganic encapsulation layer 171, a second organic encapsulation layer 172, and a third inorganic encapsulation layer 173. The first inorganic encapsulation layer 171 of the encapsulation portion 170 can be disposed on the second electrode 163. The second organic encapsulation layer 172 can be disposed on the first inorganic encapsulation layer 171. The third inorganic encapsulation layer 173 can be disposed on the second organic encapsulation layer 172. The first inorganic encapsulation layer 171 and the third inorganic encapsulation layer 173 of the encapsulation portion 170 can be formed of an inorganic material such as silicon nitride (SiNx) or silicon oxide (SiOx). The second organic encapsulation layer 172 of the encapsulation portion 170 can be formed of an organic material such as an acrylic resin, an epoxy resin, a phenolic resin, a polyamide resin, and a polyimide resin.

Referring to FIG. 4, the upper substrate 108 can be disposed on the encapsulation portion 170. The upper substrate 108 can be made of a plastic material having flexibility. When the upper substrate 108 is made of a plastic material, for example, the upper substrate 108 can be formed of polyimide (PI), but is not limited thereto. The upper substrate 108 can be made of glass.

Figure 6:
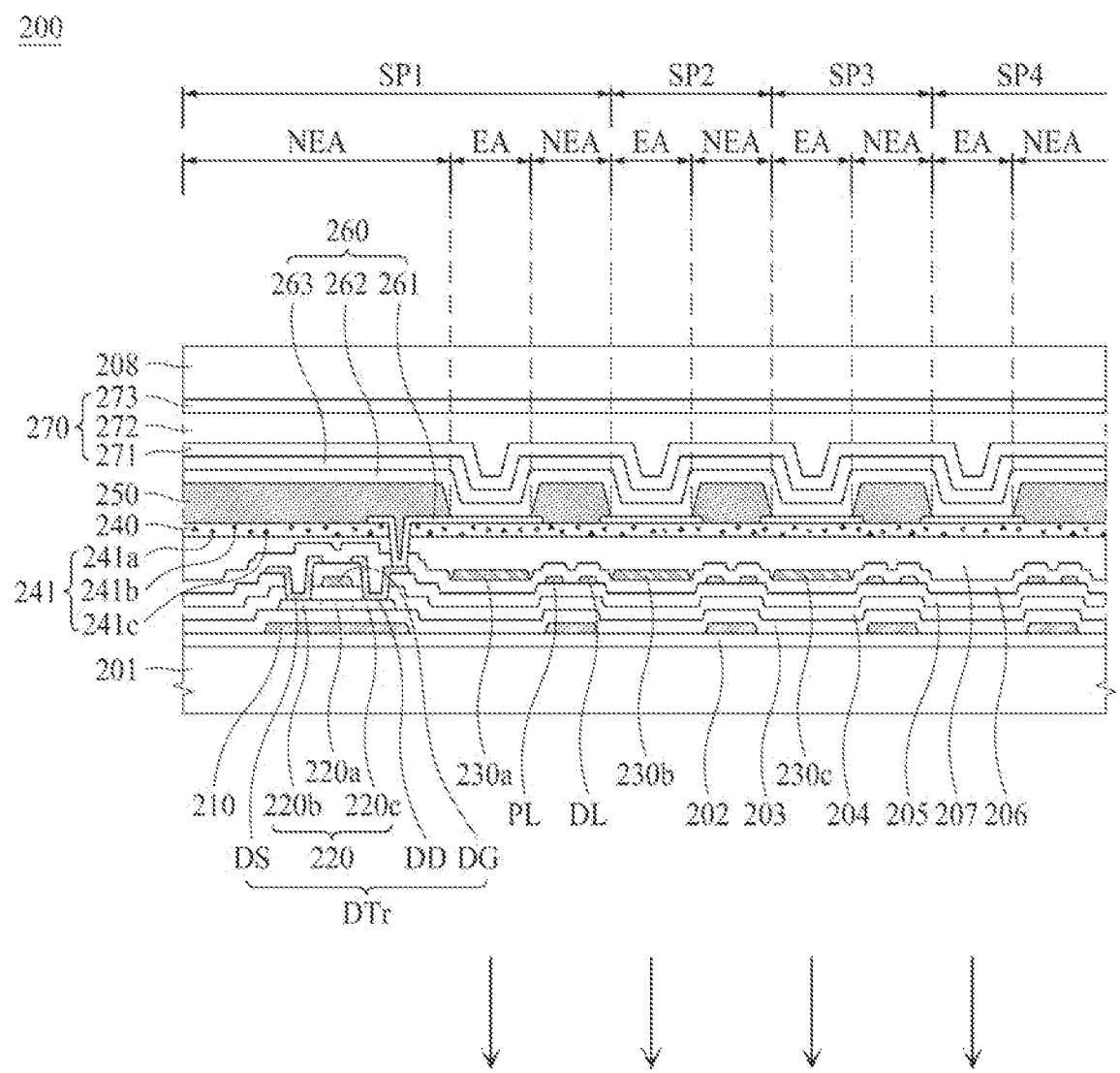
FIG. 6 is a cross-sectional view taken along line I-I' of FIG. 3 in a display device according to another embodiment of the present disclosure.

FIG. 6 is a cross-sectional view taken along line I-I' of FIG. 3 in a display device 200 according to another embodiment of the present disclosure.

Referring to FIG. 6, the display device 200 according to another embodiment of the present disclosure can include a pixel P, a data line DL, a gate line GL, a power line PL, a driving thin film transistor DTr, color filters 230a, 230b and 230c, a light emitting element 260, a lower substrate 201, an upper substrate 208, an encapsulation portion 270, a bank 250, an organic insulating layer 207, and an optical filter layer 240.

The display device 200 according to another embodiment of the present disclosure includes elements that are the same as or substantially the same as those of the display device 100 in FIGS. 1 to 4 except for the organic insulating layer 207. As such, a detailed description of the pixel P, the data line DL, the gate line GL, the power line PL, the switching thin film transistor STr, the driving thin film transistor DTr, the color filters 230a, 230b and 230c, the light emitting element 260, the lower substrate 201, the upper substrate 208, the encapsulation portion 270, the bank 250 and the optical filter layer 240 of the display device 200 according to another embodiment of the present disclosure will be omitted or may be briefly provided.

Referring to FIG. 6, the organic insulating layer 207 can be formed on the color filters 230a, 230b and 230c and a protective layer 206. The organic insulating layer 207 can protect the color filters 230a, 230b and 230c positioned below the organic insulating layer 207. Also, the organic insulating layer 207 can serve to planarize a step difference generated by the thin film transistor and the signal lines, which are formed therebelow.

The organic insulating layer 207 can be formed of an organic material such as an acrylic resin, an epoxy resin, a phenolic resin, a polyamide resin, or a polyimide resin.

The optical filter layer 240 can be disposed on an upper surface of the organic insulating layer 207. The optical filter layer 240 can have a main absorption wavelength band of 520 nm to 580 nm. Preferably, the optical filter layer 240 can primarily absorb light of a wavelength band of 550 nm. The optical filter layer 240 can be formed as an absorbent material 241 is included in an organic layer. The organic layer can be formed of an organic material such as an acryl resin, an epoxy resin, a phenolic resin, a polyamide resin, or a polyimide resin. The absorbent material 241 can be a material that primarily absorbs light of a wavelength band of 520 nm to 580 nm.

The absorbent material 241 can include a first absorbent material 241a, a second absorbent material 241b, and a third absorbent material 241c. A main absorption wavelength band of the first absorbent material 241a is 400 nm to 580 nm, and a main absorption wavelength band of the second absorbent material 241b is 520 nm to 750 nm. A main absorption wavelength band of the third absorbent material 241c is 400 nm to 520 nm and 580 to 750 nm. The amount of the second absorbent material 241b or the first absorbent material 241a can be greater than that of the third absorbent material 241c. Thus, a mixture ratio of the first absorbent material 241a, the second absorbent material 241b, and the third absorbent material 241c preferably satisfies a relation of:

the second absorbent material 241b>the first absorbent material 241a>the third absorbent material 241c, or the first absorbent material 241a>the second absorbent material 241b>the third absorbent material 241c.

The optical filter layer 240 that includes the first absorbent material 241a, the second absorbent material 241b and the third absorbent material 241c can reduce reflection of the external light in a non-emission mode of the light emitting element 260 and improve transmittance of light in a light emission mode of the light emitting element 260. Therefore, the display device comprising the optical filter layer 240 can improve transmittance by reducing loss of light emitted from the light emitting layer, and can improve reflection visibility of the external light.

Figure 7:
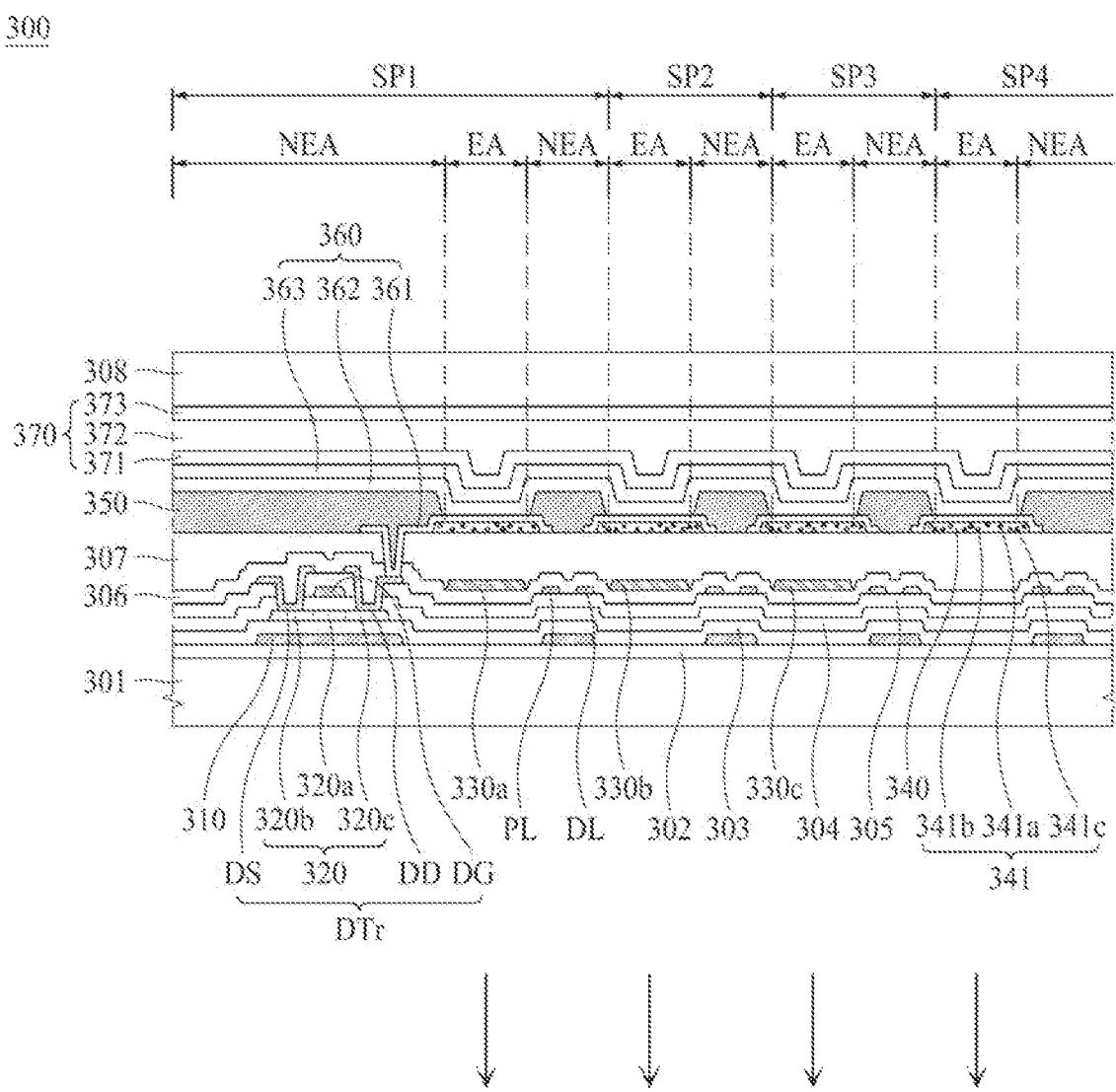
FIG. 7 is a cross-sectional view taken along line I-I' of FIG. 3 in a display device according to still another embodiment of the present disclosure.

FIG. 7 is a cross-sectional view taken along line I-I' of FIG. 3 in a display device 300 according to still another embodiment of the present disclosure.

Referring to FIG. 7, the display device 300 according to still another embodiment of the present disclosure can include a pixel P, a data line DL, a gate line GL, a power line PL, a driving thin film transistor DTr, color filters 330a, 330b and 330c, a light emitting element 360, a lower substrate 301, an upper substrate 308, an encapsulation portion 370, a bank 350, an organic insulating layer 307, and an optical filter layer 340.

The display device 300 according to still another embodiment of the present disclosure includes elements that are the same as substantially the same as those of the display device 100 shown in FIGS. 1 to 4 except for the organic insulating layer 307 and the optical filter layer 340. As such, a detailed description of the pixel P, the data line DL, the gate line GL, the power line PL, the switching thin film transistor STr, the driving thin film transistor DTr, the color filters 330a, 330b, and 330c, the light emitting element 360, the lower substrate 301, the upper substrate 308, the encapsulation portion 370, and the bank 350 of the display device 300 according to still another embodiment of the present disclosure will be omitted or may be briefly provided.

Referring to FIG. 7, the organic insulating layer 307 can be formed on the color filters 330a, 330b and 330c and a protective layer 306.

The optical filter layer 340 can be disposed on an upper surface of the organic insulating layer 307. The optical filter layer 340 can be formed only in the light emission area EA. Therefore, the optical filter layer 340 can be patterned to be disposed only in the light emission area EA. As shown in FIG. 7, the optical filter layer 340 can be disposed to overlap or to be disposed in the light emission area EA of each of the subpixels SP1, SP2, SP3 and SP4, and can be spaced apart and separated from each other by the non-light emission area NEA.

Referring to FIG. 7, the optical filter layer 340 can overlap the color filters 330a, 330b and 330c disposed in the first to third subpixels SP1, SP2 and SP3.

The optical filter layer 340 can have a main absorption wavelength band of 520 nm to 580 nm. Preferably, the optical filter layer 340 can primarily absorb light of a wavelength band of 550 nm. The optical filter layer 340 can be formed as an absorbent material 341 is included in an organic layer. The organic layer can be formed of an organic material such as an acryl resin, an epoxy resin, a phenolic resin, a polyamide resin, or a polyimide resin. The absorbent material 341 can be a material that primarily absorbs light of a wavelength band of 520 nm to 580 nm.

The absorbent material 341 can include a first absorbent material 341a, a second absorbent material 341b, and a third absorbent material 341c. A main absorption wavelength band of the first absorbent material 341a is 400 nm to 580 nm, and a main absorption wavelength band of the second absorbent material 341b is 520 nm to 750 nm. A main absorption wavelength band of the third absorbent material 341c is 400 nm to 520 nm and 580 to 750 nm. The amount of the second absorbent material 341b or the first absorbent material 341a can be greater than that of the third absorbent material 341c. Thus, a mixture ratio of the first absorbent material 341a, the second absorbent material 341b, and the third absorbent material 341c satisfies a relation of:

the second absorbent material 341b>the first absorbent material 341a>the third absorbent material 341c, or
the first absorbent material 341a>the second absorbent material 341b>the third absorbent material 341c.

The optical filter layer 340 that includes the first absorbent material 341a, the second absorbent material 341b and the third absorbent material 341c can reduce reflection of the external light in a non-emission mode and improve transmittance of light in a light emission mode. Therefore, the display device comprising the optical filter layer 340 can improve transmittance by reducing loss of light emitted from the light emitting layer, and can improve reflection visibility of the external light.

Referring to FIG. 7, a first electrode 361 of the light emitting element 360 can be disposed on the optical filter layer 340. The first electrode 361 can be electrically connected to the driving thin film transistor DTr through a contact hole formed in the organic insulating layer 307, the protective layer 306, the second interlayer insulating layer 305 and the gate insulating layer 304.

The first electrode 361 can be disposed to be patterned for each of the subpixels SP1, SP2, SP3 and SP4 on the optical filter layer 340. For example, one first electrode 361 can be formed on the optical filter layer 340 disposed in the light emission area EA of the first subpixel SP1, and another first electrode 361 can be formed on the optical filter layer 340 disposed in the light emission area EA of the second subpixel SP2. Still another first electrode 361 can be formed on the optical filter layer 340 disposed in the light emission area EA of the third subpixel SP3, and further still another first electrode 361 can be formed on the optical filter layer 340 disposed in the light emission area EA of the fourth subpixel SP4.

Referring to FIG. 7, the first electrode 361 of the light emitting element 360 can be disposed to be directly in contact with an upper surface of the optical filter layer 340. The first electrode 361 can directly cover the upper surface and both sides of the optical filter layer 340. Therefore, a lower surface of the optical filter layer 340 can be directly covered by the organic insulating layer 307, and the upper surface and both sides of the optical filter layer 340 can be covered by the first electrode 361.

The first electrode 361 can be disposed to overlap or to be disposed in the light emission area EA of each of the subpixels SP1, SP2, SP3 and SP4. The first electrode 361 can overlap the color filters 330a, 330b and 330c, and encompasses or covers entirely each optical filter layer 340 in the light emission areas EA.

The bank 350 can be disposed on the first electrode 361, the optical filter layer 340, and the organic insulating layer 307. The bank 350 can be provided between the first electrodes 361 provided in the respective subpixels SP1, SP2, SP3 and SP4. Also, the bank 350 can be formed to cover an end of each of the first electrodes 361 and expose a portion of each of the first electrodes 361.

The bank 350 can be disposed between the optical filter layers 340 provided in the respective subpixels SP1, SP2, SP3 and SP4. The bank 350 can cover an end of each of the optical filter layers 340. Therefore, both ends of the first electrode 361 and the optical filter layer 340 can be disposed between the bank 350 and the organic insulating layer 307.

The bank 350 can be disposed in the non-light emission area NEA. Therefore, the bank 350 can overlap the driving thin film transistor DTr, the power line PL, the data line DL, and the low reflection metal layer 310. The bank 350 can also overlap the switching thin film transistor STr. The bank 350 can include an organic material. The bank 350 can also include a light absorbent material. The bank 350 can have a black-based color. Therefore, the bank 350 can be a black bank.

The light emitting layer 362 of the light emitting element 360 can be disposed on the bank 350 and the first electrode 361. The light emitting layer 362 can be a layer that emits white light. A second electrode 363 can be disposed on the light emitting layer 362. The encapsulation portion 370 can be disposed on the light emitting element 360. That is, compare to the bank in FIGS. 4 and 6, the bank 350 separates the optical filter layers 340 in the subpixels from each other.

Figure 8:
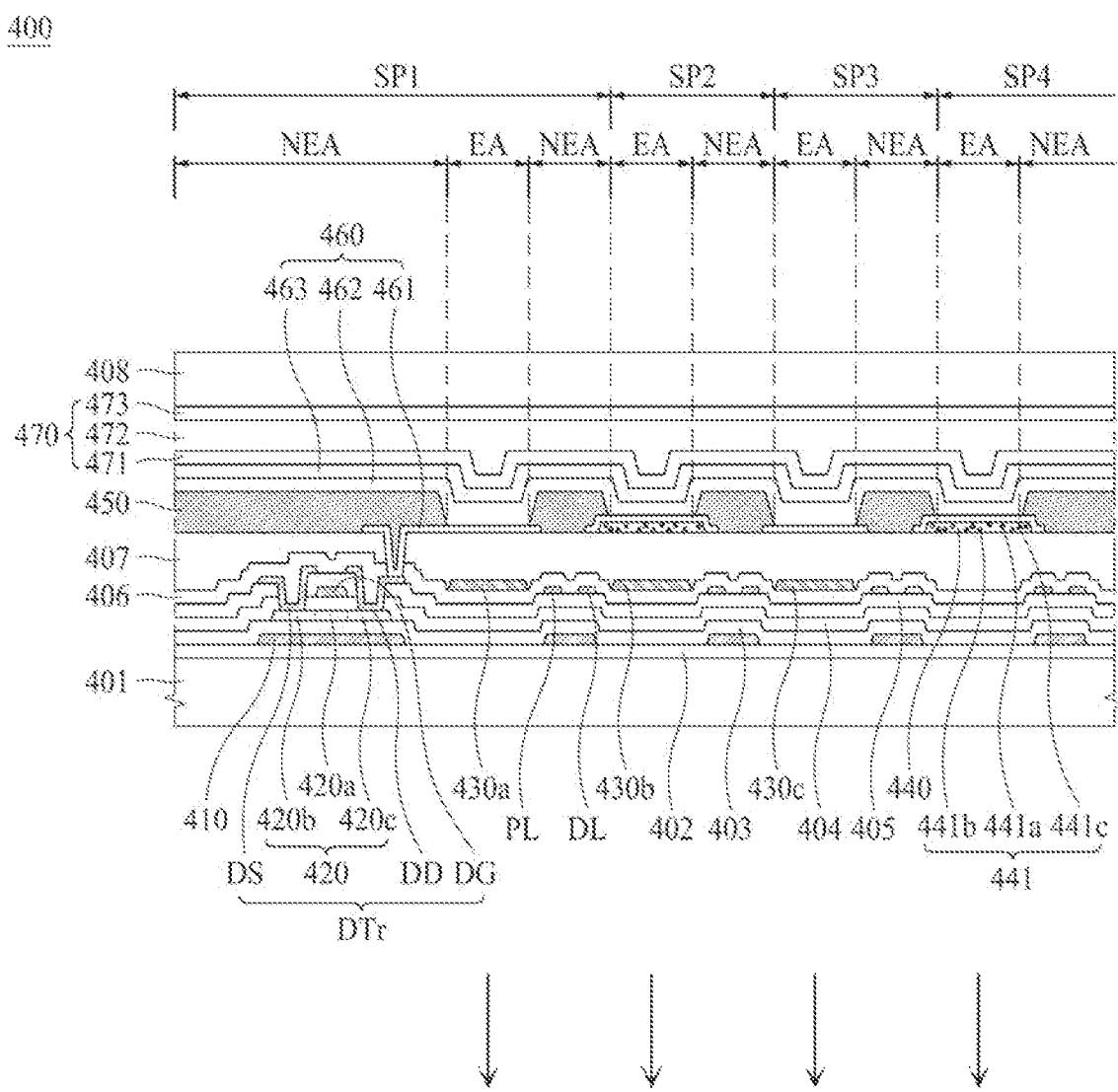
FIG. 8 is a cross-sectional view taken along line I-I' of FIG. 3 in a display device according to further still another embodiment of the present disclosure.

FIG. 8 is a cross-sectional view taken along line I-I' of FIG. 3 in a display device 400 according to further still another embodiment of the present disclosure.

Referring to FIG. 8, the display device 400 of the present disclosure can include a pixel P, a data line DL, a gate line GL, a power line PL, a driving thin film transistor DTr, color filters 430a, 430b and 430c, a light emitting element 460, a lower substrate 401, an upper substrate 408, an encapsulation portion 470, a bank 450, an organic insulating layer 407, and an optical filter layer 440.

The display device 400 according to further still another embodiment of the present disclosure includes elements that are the same as or substantially the same as those of the display device 300 shown in FIG. 7 except for the optical filter layer 440. Therefore, a detailed description of the elements substantially the same as those of FIG. 7 will be omitted or may be briefly provided.

Referring to FIG. 8, the optical filter layer 440 can be disposed on an upper surface of the organic insulating layer 407. The optical filter layer 440 can be disposed only in the light emission area EA of the second subpixel SP2 and the light emission area EA of the fourth subpixel SP4. For example, the optical filter layer 440 can be patterned to be disposed only in the light emission area EA of the green subpixel G and the light emission area EA of the white subpixel W, but not in the light emission area EA of the red and blue subpixels R and B. As shown in FIG. 8, in the sub-pixels SP1, SP2, SP3 and SP4, the optical filter layer 440 may not be formed in the first subpixel SP1 and the third subpixel SP3, but be formed only in the second subpixel SP2 and the fourth subpixel SP4.

The optical filter layer 440 can have a main absorption wavelength band of 520 nm to 580 nm. Preferably, the optical filter layer 440 can primarily absorb light of a wavelength band of 550 nm. The optical filter layer 440 can be formed as an absorbent material 441 is included in an organic layer. The organic layer can be formed of an organic material such as an acryl resin, an epoxy resin, a phenolic resin, a polyamide resin, or a polyimide resin. The absorbent material 441 can be a material that primarily absorbs light of a wavelength band of 520 nm to 580 nm.

The absorbent material 441 can include a first absorbent material 441a, a second absorbent material 441b, and a third absorbent material 441c. A main absorption wavelength band of the first absorbent material 441a is 400 nm to 580 nm, and a main absorption wavelength band of the second absorbent material 441b is 520 nm to 750 nm. A main absorption wavelength band of the third absorbent material 441c is 400 nm to 520 nm and 580 to 750 nm. The amount of the second absorbent material 441b or the first absorbent material 441a can be greater than that of the third absorbent material 441c. Thus, a mixture ratio of the first absorbent material 441a, the second absorbent material 441b, and the third absorbent material 441c satisfies a relation of:

the second absorbent material 441b>the first absorbent material 441a>the third absorbent material 441c, or the first absorbent material 441a>the second absorbent material 441b>the third absorbent material 441c.

The optical filter layer 440 that includes the first absorbent material 441a, the second absorbent material 441b and the third absorbent material 441c can reduce reflection of the external light in a non-emission mode and improve transmittance of light in a light emission mode. Therefore, the display device comprising the optical filter layer 440 can improve transmittance by reducing loss of light emitted from the light emitting layer, and can improve reflection visibility of the external light.

In the subpixels SP1, SP2, SP3 and SP4, reflection visibility due to the external light is the worst in the second subpixel SP2 that is a green subpixel and the fourth subpixel SP4 that is a white subpixel. Light of a wavelength band of 520 nm to 580 nm is light of a wavelength band that can be easily recognized by a user. Since external light reflected from a second electrode 463 of the light emitting element 460 can transmit the color filter 430b disposed to particularly emit light of a wavelength band of 550 nm at a wavelength band of 520 nm to 580 nm, the external light can be easily recognized by the user.

In case of the fourth subpixel SP4 that is a white subpixel, other elements except for the insulating layer are not disposed between the lower substrate 402 and the light emitting element 460. Therefore, the external light reflected from the second electrode 463 of the light emitting element 460 can be easily recognized by the user by passing through the insulating layer.

Therefore, the optical filter layer 440 can be disposed in the light emission area EA of the second subpixel SP2 that is a green subpixel and the light emission are EA of the fourth subpixel SP4 that is a white subpixel, wherein the reflected external light can be more easily recognized by the user in the second subpixel SP2 and the fourth subpixel SP4 than the other subpixels.

As described above, as the optical filter layer 440 can be selectively disposed in any one or more of the subpixels SP1, SP2, SP3 and SP4, loss of the light emitted from the light emitting layer 462 of the light emitting element 460 can be reduced. Therefore, transmittance of the light emitted from the light emitting layer 462 can be improved.

Figure 9:
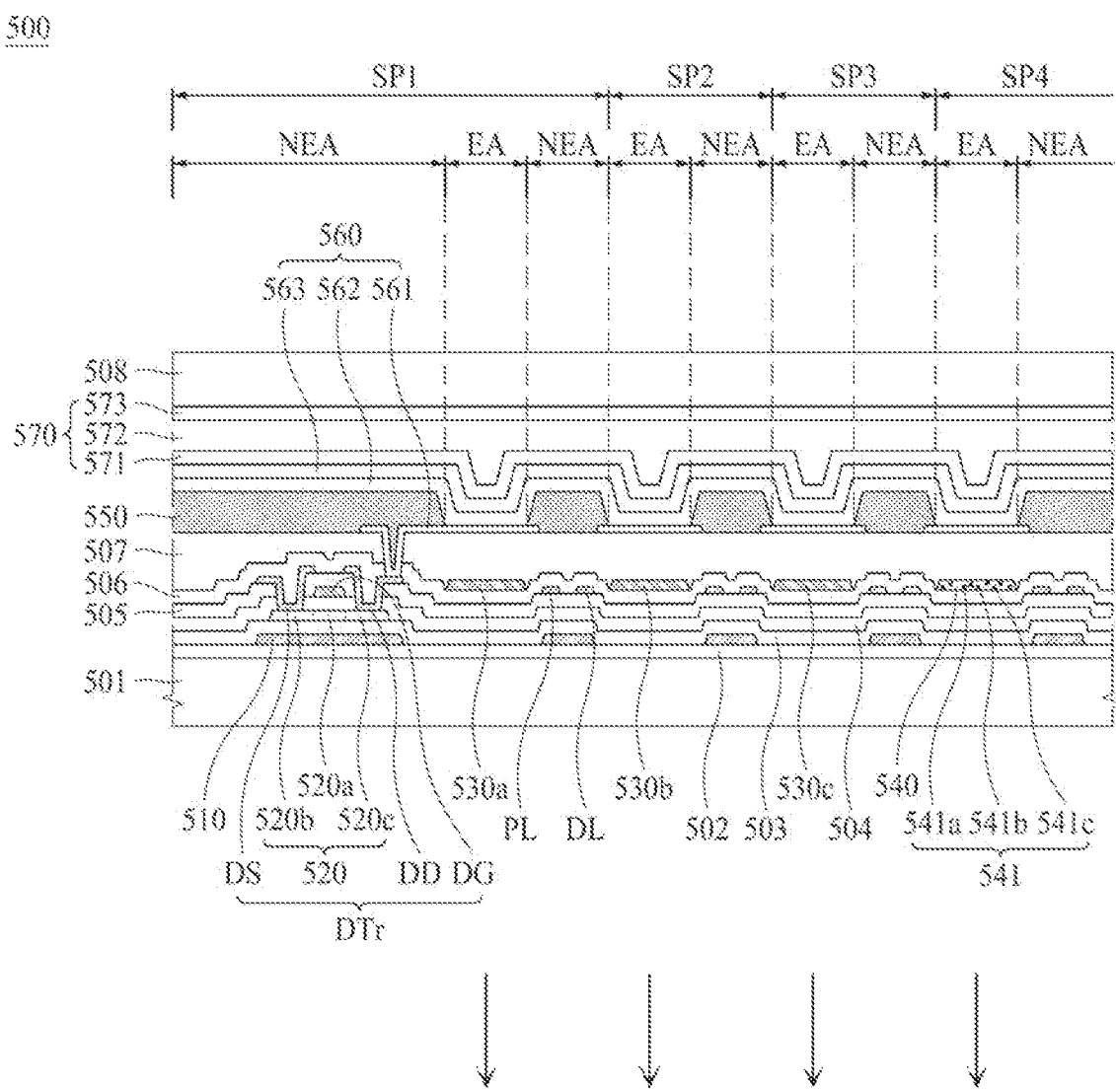
FIG. 9 is a cross-sectional view taken along line I-I' of FIG. 3 in a display device according to further still another embodiment of the present disclosure.

FIG. 9 is a cross-sectional view taken along line I-I' of FIG. 3 in a display device 500 according to further still another embodiment of the present disclosure.

Referring to FIG. 9, the display device 500 of the present disclosure can include a pixel P, a data line DL, a gate line GL, a power line PL, a driving thin film transistor DTr, color filters 530a, 530b and 530c, a light emitting element 560, a lower substrate 501, an upper substrate 508, an encapsulation portion 570, a bank 550, an organic insulating layer 507, and an optical filter layer 540.

The display device 500 according to further still another embodiment of the present disclosure includes elements that are the same as or substantially the same as those of the display device 300 shown in FIG. 7 except for the optical filter layer 540. Therefore, a detailed description of the elements substantially the same as those of FIG. 7 will be omitted or may be briefly provided.

Referring to FIG. 9, the color filters 530a, 530b, and 530c and the optical filter layer 540 can be disposed on a protective layer 506. The color filters 530a, 530b, and 530c can be disposed in the light emission areas EA of the first subpixel SP1, the second subpixel SP2 and the third subpixel SP3. The optical filter layer 540 can be disposed in the light emission area EA of the fourth subpixel SP4. For example, the color filters 530a, 530b, and 530c can be disposed in the light emission area EA in the first subpixel SP1 that is a red subpixel R, the second subpixel SP2 that is a green subpixel G, and the third subpixel SP3 that is a blue subpixel B. The optical filter layer 540 can be disposed in the light emission area EA in the fourth subpixel SP4 that is a white subpixel W.

The red color filter 530a for converting white light emitted from a light emitting layer 562 into red light can be disposed in the light emission area EA of the first subpixel SP1, and the green color filter 530b for converting the white light emitted from the light emitting layer 562 into green light can be disposed in the light emission area EA of the second subpixel SP2. The blue color filter 530c for converting white light emitted from the light emitting layer 562 into blue light can be disposed in the light emission area EA of the third subpixel SP3. In addition, the optical filter layer 540 for reducing reflection of external light can be disposed in the light emission area EA of only the fourth subpixel SP4, but not in the first, second and third subpixels SP1, SP2 and SP3. Therefore, external light reflected from a second electrode 563 of the light emitting element 560 can be reduced through the optical filter layer 540 in the light emission area EA of the fourth subpixel SP4.

As described above, as the optical filter layer 540 is disposed on the same layer as the color filters 530a, 530b and 530c disposed in the first subpixel SP1, the second subpixel SP2 and the third subpixel SP3, occurrence of a step difference between the fourth subpixel SP4 and the other subpixels SP1, SP2 and SP3 can be avoided. For example, the color filters 530a, 530b and 530c can be coplanar with the optical filter layer 540. Therefore, occurrence of a step difference can be avoided between the fourth subpixel SP4 in which the optical filter layer 540 is formed and the other subpixels SP1, SP2 and SP3 in which the optical filter layer 540 is not formed.

In addition, as the optical filter layer 540 is selectively disposed in any one or more of the subpixels SP1, SP2, SP3 and SP4, loss of the light emitted from the light emitting layer 562 of the light emitting element 560 can be reduced. Therefore, the transmittance of the light emitted from the light emitting layer 562 can be improved.

Referring to FIG. 9, the organic insulating layer 507 can be disposed on the optical filter layer 540 and/or the color filters 530a, 530b and 530c and on the protective layer 506.

A first electrode 561 of the light emitting element 560 can be disposed on the organic insulating layer 507. The first electrode 561 can be disposed to be patterned for each of the subpixels SP1, SP2, SP3 and SP4 on the organic insulating layer 507. The bank 550 can be disposed on the first electrode 561 and the organic insulating layer 507. Also, the bank 550 can be formed to cover an end of each of the first electrodes 561 and expose a portion of each of the first electrodes 561. The bank 550 can be a black bank. The light emitting layer 562 of the light emitting element 560 can be disposed on the bank 550 and the first electrode 561. The light emitting layer 562 can be a layer that emits white light. The second electrode 563 can be disposed on the light emitting layer 562.

The encapsulation portion 570 can be disposed on the second electrode 563 of the light emitting element 560, and the upper substrate 508 can be disposed on the encapsulation portion 570.

The display device according to one embodiment of the present disclosure can comprise a substrate including first to fourth subpixels and having a light emission area and a non-light emission area for each subpixel, a thin film transistor disposed in the non-light emission area of the substrate, a protective layer disposed on the thin film transistor, a color filter disposed on the protective layer and disposed in a light emission area of each of the first subpixel, the second subpixel and the third subpixel, an optical filter layer disposed on the color filter, including a first absorbent material, a second absorbent material, and a third absorbent material, and a light emitting element disposed on the optical filter layer.

According to one embodiment of the present disclosure, the optical filter can have an absorption wavelength band of 400 nm to 750 nm, and can have a main absorption wavelength band of 520 nm to 580 nm.

According to one embodiment of the present disclosure, the first absorbent material can have a main absorption wavelength band of 400 nm to 580 nm, the second absorbent material can have a main absorption wavelength band of 520 nm to 750 nm, and the third absorbent material can have a main absorption wavelength band of 400 nm to 520 nm and 580 nm to 750 nm.

According to one embodiment of the present disclosure, the amount of the second absorbent material or the first absorbent material can be greater than that of the third absorbent material. According to one embodiment of the present disclosure, a mixture ratio of the first absorbent material, the second absorbent material and the third absorbent material can satisfy the following relation:

the second absorbent material>the first absorbent material>the third absorbent material.

According to one embodiment of the present disclosure, a mixture ratio of the first absorbent material, the second absorbent material and the third absorbent material can satisfy the following relation:

the first absorbent material>the second absorbent material>the third absorbent material.

The display device according to one embodiment of the present disclosure can further comprise an organic insulating layer disposed between the optical filter layer and the protective layer.

According to one embodiment of the present disclosure, the light emitting element can include a first electrode disposed on the optical filter layer, a light emitting layer disposed on the first electrode, emitting white light, and a second electrode disposed on the light emitting layer.

The display device according to one embodiment of the present disclosure can further comprise a bank disposed on the optical filter layer, covering an edge of the first electrode.

According to one embodiment of the present disclosure, the bank can include a light absorbent material.

According to one embodiment of the present disclosure, the second subpixel can be disposed to be adjacent to the first subpixel based on a first direction, and the third subpixel can be disposed to be adjacent to the second subpixel based on the first direction, and the fourth subpixel can be disposed to be adjacent to the third subpixel based on the first direction.

The display device according to one embodiment of the present disclosure can further comprise a low reflection metal layer disposed in each of the non-light emission areas of the first to fourth subpixels, wherein the low reflection metal layer can include a lower metal layer, an upper metal layer disposed on the lower metal layer, and a transparent conductive layer disposed between the lower metal layer and the upper metal layer.

The display device according to another embodiment of the present disclosure can comprise a substrate including first to fourth subpixels, having a light emission area and a non-light emission area for each subpixel, a thin film transistor disposed in the non-light emission area of the substrate, a protective layer disposed on the thin film transistor, a color filter disposed on the protective layer and disposed in a light emission area of each of the first to third subpixels, an organic insulating layer disposed on the color filter and the protective layer, an optical filter layer disposed on the organic insulating layer, including a first absorbent material, a second absorbent material, and a third absorbent material, and a light emitting element disposed on the optical filter layer.

According to another embodiment of the present disclosure, the first absorbent material can have a main absorption wavelength band of 400 nm to 580 nm, the second absorbent material can have a main absorption wavelength band of 520 nm to 750 nm, and the third absorbent material can have a main absorption wavelength band of 400 nm to 520 nm and 580 nm to 750 nm.

According to another embodiment of the present disclosure, a mixture ratio of the first absorbent material, the second absorbent material and the third absorbent material can satisfy a relation such as 'the second absorbent material>the first absorbent material>the third absorbent material' or 'the first absorbent material>the second absorbent material>the third absorbent material.'

According to another embodiment of the present disclosure, the light emitting element can include a first electrode disposed on the optical filter layer, a light emitting layer disposed on the first electrode, emitting white light, and a second electrode disposed on the light emitting layer.

According to another embodiment of the present disclosure, the optical filter layer can be disposed between the first electrode and the organic insulating layer, and the first electrode can be disposed to directly cover an upper surface and both sides of the optical filter layer.

According to another embodiment of the present disclosure, the optical filter layer can be disposed only in the light emission area, and can be spaced apart from another optical filter layer by the non-light emission area.

According to another embodiment of the present disclosure, the first subpixel can be a red subpixel, the second subpixel can be a green subpixel, the third subpixel can be a blue subpixel, and the fourth subpixel can be a white subpixel.

According to another embodiment of the present disclosure, the optical filter layer can be disposed only in the light emission area of the second subpixel that is the green subpixel and the light emission area of the fourth subpixel that is the white subpixel.

A display device according to other embodiment of the present disclosure can comprise a substrate including first to fourth subpixels, having a light emission area and a non-light emission area for each subpixel, a thin film transistor disposed in the non-light emission area of the substrate, a protective layer disposed on the thin film transistor, a color filter disposed on the protective layer and disposed in a light emission area of each of the first to third subpixels, an optical filter layer disposed in the light emission area of the fourth subpixel on the protective layer, including a first absorbent material, a second absorbent material, and a third absorbent material, an organic insulating layer disposed on the optical filter layer, the color filter, and the protective layer, and a light emitting element disposed on the organic insulating layer.

According to the present disclosure, the following advantageous effects can be obtained.

According to the present disclosure, the optical filter layer that includes the first absorbent material, the second absorbent material and the third absorbent material can reduce reflection of external light in the non-emission mode and improve transmittance of light in the light emission mode. Therefore, the display device comprising an optical filter layer can improve transmittance by reducing loss of light emitted from the light emitting layer, and can improve reflection visibility of the external light.

In addition, according to the present disclosure, the display device comprising an optical filter layer can have reflection visibility more excellent than that of the display device to which a polarizing plate POL is attached, and can also have transmittance more excellent than that of the display device to which a polarizing plate POL is attached.

According to the present disclosure, since the display device includes an optical filter layer that primarily absorbs light of a wavelength band of 520 nm to 580 nm, which can be easily recognized by a user, reflection visibility due to external light can be improved.

According to the present disclosure, the display device comprising an optical filter layer can reduce reflectance of the external light and improve transmittance of light emitted from the light emitting layer of the light emitting element.

According to the present disclosure, in the non-light emission mode in which the light emitting layer of the light emitting element does not emit light, the external light can be partially absorbed when passing through the optical filter layer by passing through the lower substrate. The external light passing through the optical filter layer can be reflected from the second electrode of the light emitting element disposed in the light emission area EA. The external light reflected from the second electrode can be absorbed once again while passing through the optical filter layer. Therefore, reflection visibility of the display device due to external light can be improved.

It will be apparent to those skilled in the art that the present disclosure described above is not limited by the above-described embodiments and the accompanying drawings and that various substitutions, modifications and variations can be formed in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display device comprising:
   a substrate including a first subpixel, a second subpixel, a third subpixel and a fourth subpixel, and having a light emission area and a non-light emission area for each of the first to fourth subpixels;
   a thin film transistor disposed in each of the non-light emission areas of the substrate;
   a protective layer disposed on the thin film transistors;
   a color filter disposed on the protective layer and disposed in a light emission area of each of the first subpixel, the second subpixel and the third subpixel;
   an optical filter layer disposed on the color filter, and including a first absorbent material, a second absorbent material, and a third absorbent material; and
   a light emitting element disposed on the optical filter layer.

2. The display device of claim 1, wherein the optical filter layer has an absorption wavelength band of about 400 nm to 750 nm.

3. The display device of claim 2, wherein the optical filter layer has a main absorption wavelength band of about 520 nm to 580 nm.

4. The display device of claim 1, wherein the first absorbent material has a main absorption wavelength band of about 400 nm to 580 nm,
   the second absorbent material has a main absorption wavelength band of about 520 nm to 750 nm, and the third absorbent material has a main absorption wavelength band of about 400 nm to 520 nm and 580 nm to 750 nm.

5. The display device of claim 1, wherein an amount of the second absorbent material or the first absorbent material included in the optical filter layer is greater than an amount of the third absorbent material included in the optical filter layer.

6. The display device of claim 5, wherein a mixture ratio of the first absorbent material, the second absorbent material and the third absorbent material satisfies the following relation:
the second absorbent material>the first absorbent material>the third absorbent material, or
the first absorbent material>the second absorbent material>the third absorbent material.

7. The display device of claim 1, wherein the optical filter layer directly contacts an upper surface of the color filter.

8. The display device of claim 1, wherein the light emitting element includes:
a first electrode disposed on the optical filter layer,
a light emitting layer disposed on the first electrode, and configured to emit white light, and
a second electrode disposed on the light emitting layer, and
wherein the display device further comprises a bank disposed on the optical filter layer, and covering an edge of the first electrode in each of the first to fourth subpixels.

9. The display device of claim 8, wherein the bank includes a light absorbent material.

10. The display device of claim 1, wherein the second subpixel is disposed to be adjacent to the first subpixel based on a first direction,
the third subpixel is disposed to be adjacent to the second subpixel based on the first direction,
the fourth subpixel is disposed to be adjacent to the third subpixel based on the first direction, and
the first to fourth subpixels are respectively a red subpixel, a green subpixel, a blue subpixel and a white subpixel.

11. The display device of claim 1, further comprising a low reflection metal layer disposed in each of the non-light emission areas of the first to fourth subpixels,
wherein the low reflection metal layer includes a lower metal layer, an upper metal layer disposed on the lower metal layer, and a transparent conductive layer disposed between the lower metal layer and the upper metal layer.

12. The display device of claim 1, further comprising an organic insulating layer disposed and extending between the optical filter layer and the protective layer.

13. The display device of claim 12, wherein an amount of the second absorbent material or the first absorbent material included in the optical filter layer is greater than an amount of the third absorbent material included in the optical filter layer.

14. The display device of claim 12, further comprising a bank disposed on the optical filter layer,
wherein the bank separates the optical filter layer in the first to fourth subpixels from each other.

15. The display device of claim 14, wherein the light emitting element includes a first electrode disposed on the optical filter layer, a light emitting layer disposed on the first electrode, emitting white light, and a second electrode disposed on the light emitting layer, and
the first electrode is disposed to directly cover an upper surface and both sides of the optical filter layer.

16. The display device of claim 1, wherein the optical filter layer is provided in the light emission area of only the second and fourth subpixels among the first to fourth subpixels.

17. The display device of claim 16, wherein the second subpixel is a green subpixel and the fourth subpixel is a white subpixel.

18. A display device comprising:
a substrate including a first subpixel, a second subpixel, a third subpixel and a fourth subpixel, and having a light emission area and a non-light emission area for each of the first to fourth subpixels;
a thin film transistor disposed in each of the non-light emission areas of the substrate;
a protective layer disposed on the thin film transistors;
a color filter disposed on the protective layer and disposed in the light emission area of each of the first to third subpixels;
an optical filter layer disposed on the protective layer and disposed in the light emission area of the fourth subpixel, the optical filter layer including a first absorbent material, a second absorbent material, and a third absorbent material; and
a light emitting element disposed on at least one of the color filter and the optical filter layer.

19. The display device of claim 18, further comprising:
an organic insulating layer disposed on the color filter or the optical filter layer.

20. The display device of claim 19, wherein the organic insulating layer is disposed on the optical filter layer, and is present only in the fourth subpixel among the first to fourth subpixels.

* * * * *